(12) United States Patent
Yamada et al.

(10) Patent No.: US 11,132,953 B2
(45) Date of Patent: Sep. 28, 2021

(54) DISPLAY DEVICE

(71) Applicant: SHARP KABUSHIKI KAISHA, Sakai (JP)

(72) Inventors: Junichi Yamada, Sakai (JP); Makoto Yokoyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/981,170

(22) PCT Filed: Mar. 19, 2018

(86) PCT No.: PCT/JP2018/010757
§ 371 (c)(1),
(2) Date: Sep. 15, 2020

(87) PCT Pub. No.: WO2019/180768
PCT Pub. Date: Sep. 26, 2019

(65) Prior Publication Data
US 2021/0020111 A1    Jan. 21, 2021

(51) Int. Cl.
*G09G 3/3266* (2016.01)
*G09G 3/3275* (2016.01)
*H01L 27/32* (2006.01)

(52) U.S. Cl.
CPC ......... *G09G 3/3266* (2013.01); *G09G 3/3275* (2013.01); *H01L 27/3276* (2013.01)

(58) Field of Classification Search
CPC . G09G 3/3266; G09G 3/3275; H01L 27/3276
See application file for complete search history.

(56) References Cited

U.S. PATENT DOCUMENTS

| | | | |
|---|---|---|---|
| 9,978,314 B2 * | 5/2018 | Bae | G11C 19/28 |
| 10,115,780 B2 * | 10/2018 | Kim | H01L 27/3262 |
| 10,312,309 B2 * | 6/2019 | Lin | H01L 27/3246 |
| 10,483,341 B2 * | 11/2019 | Jung | G09G 3/20 |
| 10,636,859 B2 * | 4/2020 | Park | G09G 3/3266 |
| 10,839,762 B2 * | 11/2020 | Miyanaga | G09G 3/3677 |
| 2009/0102758 A1 | 4/2009 | Anzai et al. | |
| 2017/0352328 A1 * | 12/2017 | Jeong | G09G 3/3266 |

FOREIGN PATENT DOCUMENTS

JP    2009-134246 A    6/2009

* cited by examiner

*Primary Examiner* — Sardis F Azongha
(74) *Attorney, Agent, or Firm* — ScienBiziP, P.C.

(57) ABSTRACT

To provide a display device including a display panel having an irregular shape capable of narrowing the frame even in a case where two types of drive circuits are arranged.
In a display panel having an irregular shape including a frame formed from straight line regions and curved line regions, scanning circuits and emission circuits are separated. Then, the separated scanning circuits are arranged in a first corner portion, which is the curved line region of the display panel, while being shifted along an outer peripheral edge of a display region, and the emission circuits are arranged in a row on a second side, which is the straight line region.

15 Claims, 29 Drawing Sheets

(a)
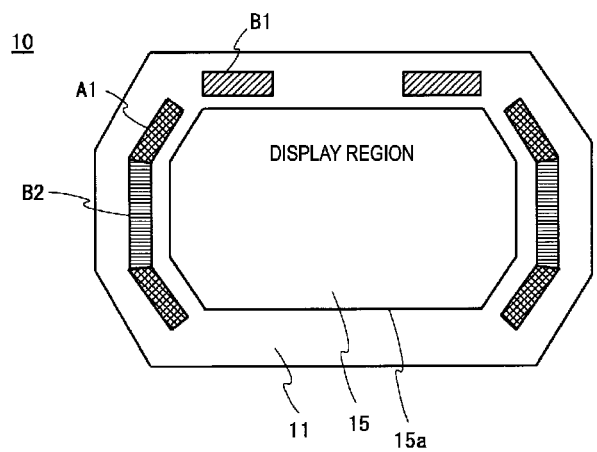
(b)
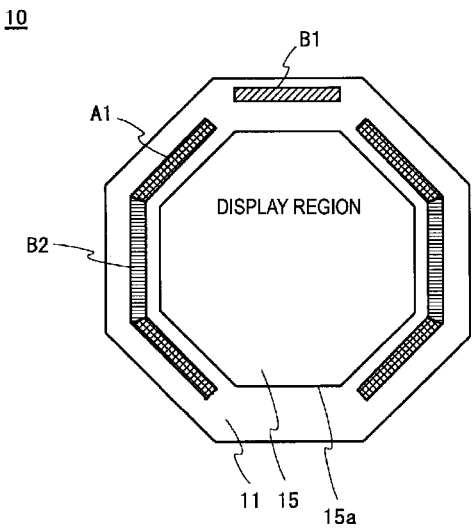
FIG. 29

DISPLAY DEVICE

TECHNICAL FIELD

The disclosure described below relates to a display device, and more particularly, to a display device including electro-optical elements driven by a current such as an organic EL display device.

BACKGROUND ART

Currently, an organic Electro Luminescence (EL) display device has attracted attention as a display device having features such as a thin profile, high resolution, and low power consumption, and development thereof has been actively advanced. A display panel configured to display an image in the organic EL display device includes a display region in which a plurality of pixel circuits are arranged, and a frame in which a drive circuit that drives each of the pixel circuits is arranged so as to surround the display region.

In recent years, display panels having irregular shapes (irregular panels) have also been often used as display panels in place of known display panels having rectangular shapes in order to reduce the size of electronic devices with the widespread use of portable electronic devices. In a display panel having an irregular shape, a panel in which corner portions have a smooth arc shape is often used. In order to make the frame of such a display panel having an irregular shape narrower, it is necessary to arrange the drive circuits also on the frame of the corner portions.

PTL 1 discloses arranging a plurality of unit circuits constituting scanning line drive circuits along an outer peripheral edge of a display region while being shifted in the extending direction of the scanning lines in a case of arranging a plurality of drive circuits on the frame of corner portions. As a result, the frame of a reduced profile display panel having an irregular shape can be made narrower.

CITATION LIST

Patent Literature

PTL 1: JP 2009-134246 A

SUMMARY

Technical Problem

However, PTL 1 discloses a method of making a frame narrower by arranging a single type of unit circuits (drive circuits) in a frame of corner portions of a display panel having an irregular shape, but it does not disclose how to arrange drive circuits to make narrowing a frame possible in a case of arranging two types of drive circuits.

Therefore, an object of the disclosure is to provide a display device including a display panel having an irregular shape capable of narrowing the frame even in a case where two types of drive circuits are arranged.

Solution to Problem

A display device including: a display region including a plurality of scanning lines, a plurality of light emission control lines extending parallel to the plurality of scanning lines, a plurality of data lines intersecting with the plurality of scanning lines and the plurality of light emission control lines, and a plurality of pixel circuits each provided at or near each intersection between the plurality of scanning lines and the plurality of data lines; and a display panel provided around the display region, the display panel including a frame provided with a plurality of scanning circuits each configured to output scanning signals to the plurality of scanning lines, and a plurality of emission circuits each configured to output light emission control signals to the plurality of light emission control lines, wherein the frame includes at least one corner portion formed from a curved line region or an inclined region, and a first side parallel to the data lines and a second side parallel to the scanning lines formed to sandwich the corner portion, either circuits of the scanning circuits or the emission circuits are arranged on the second side, and wiring lines extending from the either circuits arranged on the second side extend from the second side to the corner portion, and are connected to the scanning lines or the light emission control lines in an outer peripheral edge of the display region.

Advantageous Effects of Disclosure

According to a first aspect, in the display panel having an irregular shape, either circuits of the scanning circuits or the emission circuits are arranged on the second side, and wiring lines extending from the either circuits are extended from the second side to the corner portion to connect with wiring lines formed in the display region. As a result, the width of the corner portion can be made narrower, and thus the frame of the display panel having an irregular shape can be made narrower.

BRIEF DESCRIPTION OF DRAWINGS

FIG. 29 is a diagram illustrating another example of a shape of a display panel and display region to which the first to third embodiments can be applied.

DESCRIPTION OF EMBODIMENTS

The first to third embodiments will be described below with reference to the accompanying drawings. Note that, in the description of each embodiment, descriptions of comparative examples corresponding to the respective embodiments will be described, and features of the respective embodiments will be described in contrast to the comparative examples. All the transistors used in the circuits described below are described as P-channel type transistors, but the disclosure is not limited thereto, and N-channel type transistors may be adopted. Furthermore, the transistors according to each of the embodiments are, for example, thin film transistors (TFT), but the disclosure is not limited to this. Further yet, the term "connection" used herein means "electrical connection" unless otherwise specified, and without departing from the spirit and scope of the disclosure, the term includes not only a case in which direct connection is meant but also a case in which indirect connection with another element therebetween is meant.

1. First Embodiment 1.1 Configuration of Organic EL Display Device

Figure 1:
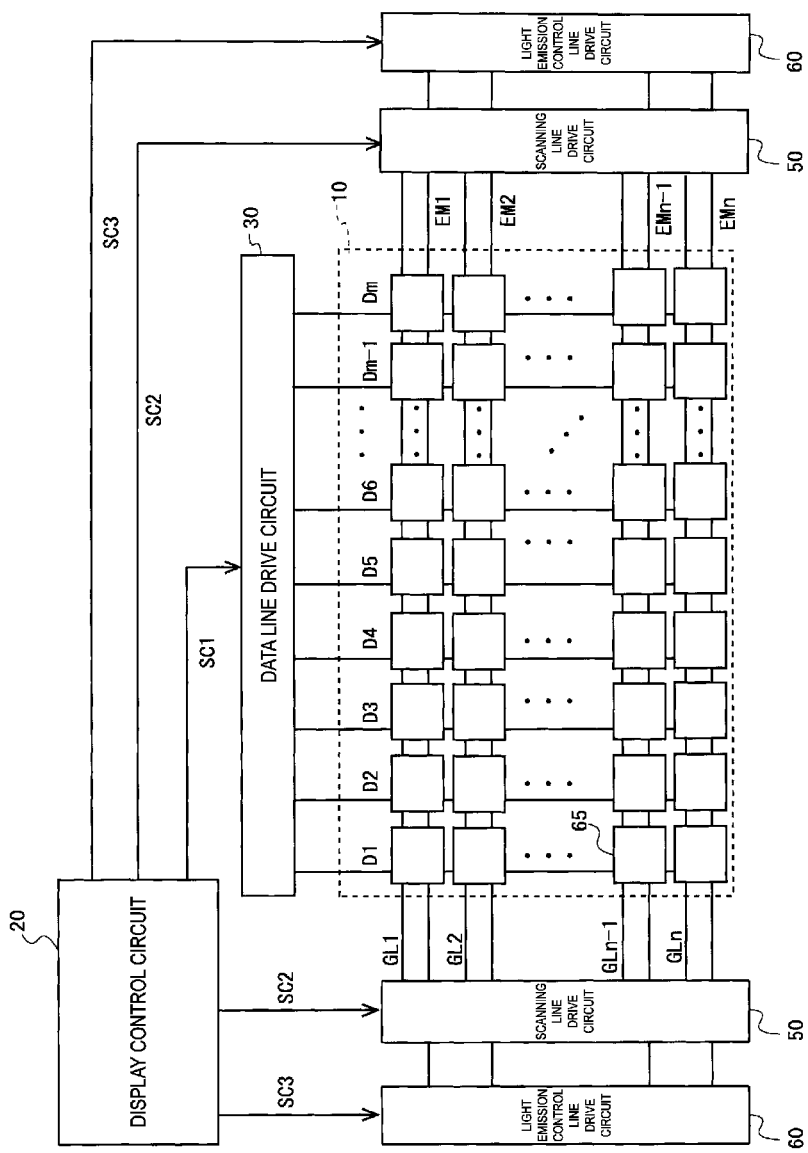
FIG. 1 is a block diagram illustrating a configuration of a display device according to a first embodiment.

FIG. 1 is a block diagram illustrating a configuration of an organic EL display device according to the first embodiment. As illustrated in FIG. 1, the organic EL display device (in the following, simply referred to as a "display device") includes a display panel 10, a display control circuit 20, a data line drive circuit 30, scanning line drive circuits 50, and light emission control line drive circuits 60. Two scanning line drive circuits 50 and light emission control line drive circuits 60 are provided, which are arranged on opposite sides of the display panel 10.

The display panel 10 includes m data lines D1 to Dm (m represents an integer equal to or greater than 1) arranged in the display panel. n scanning lines GL1 to GLn that intersect with the data lines D1 to Dm extend from the scanning line drive circuits 50. n light emission control lines EM1 to EMn extend from the light emission control line drive circuits 60 parallel to the n scanning lines GL1 to GLn. Each pixel circuit 65 is provided in the vicinity of intersection of each data line and each scanning line. Each pixel circuit 65 emits light in response to a data signal supplied from the data line and displays an image on the display panel 10.

The data line drive circuit 30 generates data signals based on the data DA and the control signal SC1 provided from the display control circuit 20, and supplies each of the data signals in one horizontal line for each horizontal interval to each of the data lines D1 to Dm. The scanning line drive circuits 50 generate scanning signals based on the control signal SC2 provided from the display control circuit 20, and supply the scanning signals to the scanning lines GL1 to GLn sequentially. In this way, the pixel circuits 65 connected to the scanning lines provided with the scanning signals are selected sequentially. The light emission control line drive circuits 60 generate light emission control signals based on the control signal SC3 provided from the display control circuit 20, and supply the light emission control signals to the light emission control lines EM1 to EMn connected to the pixel circuits 65 to which the data signals have been written. The scanning line drive circuits 50 are configured with n scanning circuits that drive the scanning lines GL1 to GLn, respectively, and the light emission control line drive circuits 60 are configured with n emission circuits that drive the light emission control lines EM1 to EMn, respectively. These circuits are formed in the frame of the display panel 10 as gate driver monolithic (GDM).

In a case where a data signal is provided to each data line and a scanning signal of a low level is provided to a scanning line, pixel circuits connected to the scanning line are selected, and the data signals are written from the data lines. At this time, the control signal SC3 is provided to the pixel circuits 65 via a light emission control line from the light emission control line drive circuit 60. As a result, the drive current corresponding to the data signal flows to the organic EL display elements (electro-optical elements) provided in the pixel circuits 65, and the organic EL display elements emit light. Thus, the pixel circuits 65 emit light at a gray scale corresponding to the data signals, and an image is displayed on the display panel 10.

Note that, in order to reduce the number of output terminals of the data line drive circuit 30, the display device may be driven by a driving method referred to as Source Shared Driving (SSD), in which a demultiplexer unit is provided between the data line drive circuit 30 and each pixel forming section, and data signals are supplied from the data line drive circuit 30 to data lines via the demultiplexer unit.

1.2 Shape of Display Panel

Figure 2:
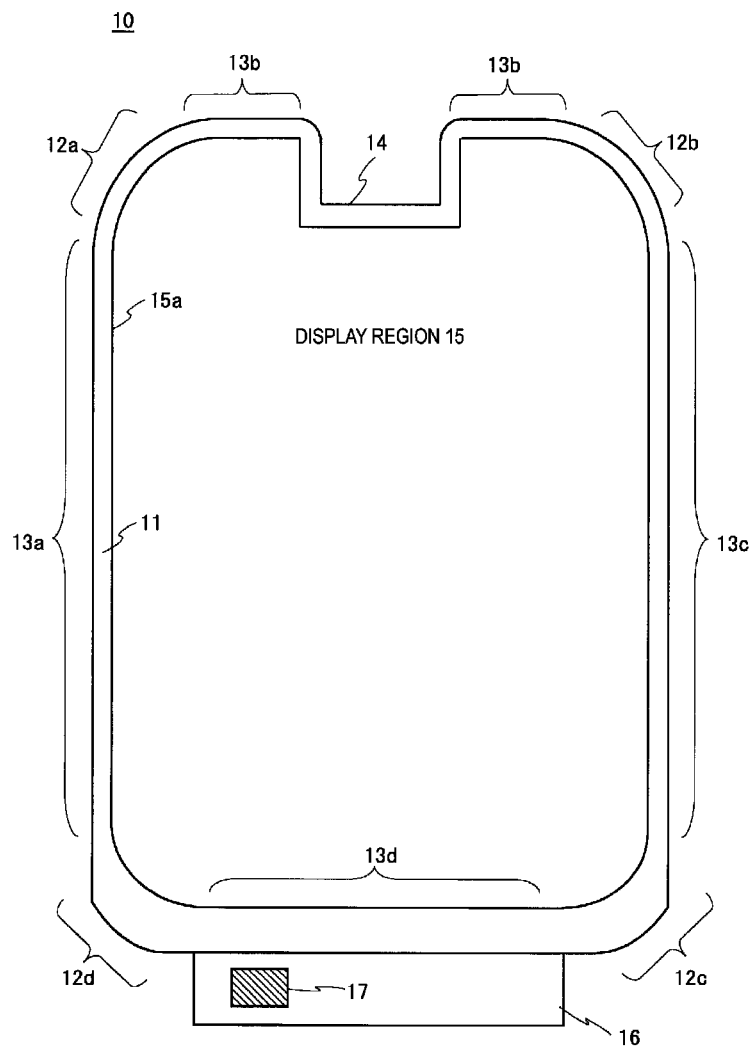
FIG. 2 is a diagram illustrating a display panel having an irregular shape included in the display device illustrated in FIG. 1.

FIG. 2 is a diagram illustrating a display panel (irregular panel) 10 having an irregular shape that is included in the display device according to the present embodiment. As illustrated in FIG. 2, shapes of corner portions of a frame 11 and a display region 15 of the display panel 10 in the present embodiment are curved, and a shape of regions except the corner portions are straight. Then, in the present specification, the frame 11 sandwiched by the curved lines of the corner portions of the display region 15 and the curved lines of the corner portions of the frame 11 is referred to as curved line regions, and the frame 11 sandwiched by the straight lines of the display region 15 and the straight lines of the frame 11 is referred to as straight line regions. For this reason, four curved line regions and straight line regions are formed in the display panel 10, and the curved line regions and the straight line regions are arranged alternately. A notch (cut portion) 14 for incorporating a lens or the like, for example, is provided on the upper portion of the display panel 10, and a circuit substrate 16 having a rectangular shape is attached to the lower portion.

In the following description, of the four curved line regions illustrated in FIG. 2, the frame of the upper left curved line region is referred to as a "first corner portion 12a", and the following in clockwise are referred to as a "second corner portion 12b", a "third corner portion 12c", and a "fourth corner portion 12d". Of the four straight line regions, the frame of the straight line region on the left end portion is referred to as a "first side 13a", the frame of the straight line region on the upper portion is referred to as a "second side 13b", the frame of the straight line region on the right end portion is referred to as a "third side 13c", and the frame of the straight line region on the lower portion is referred to as a "fourth side 13d".

In the following description, a case in which the scanning circuits and the emission circuits are arranged mainly in the first corner portion 12a, and the second side 13b and the first side 13a that sandwich the first corner portion 12a will be described in detail, and a case in which the scanning circuits and the emission circuits are arranged on other corner portions and sides will be described briefly.

Figure 3:
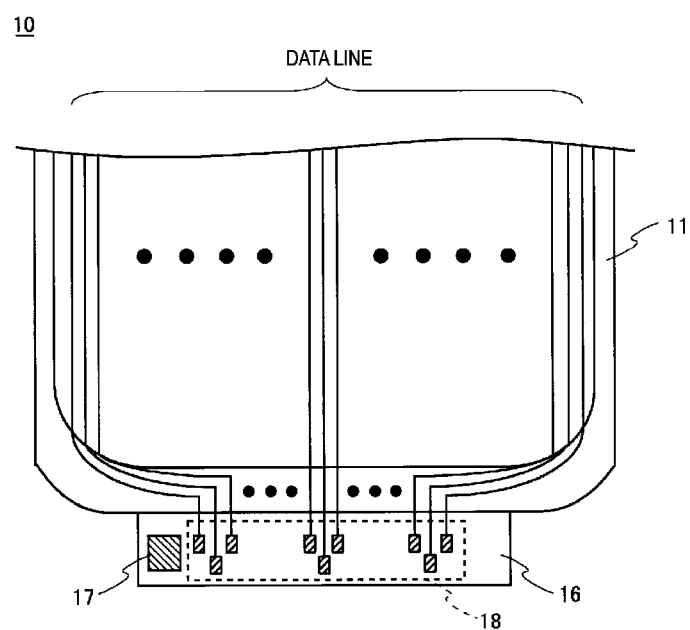
FIG. 3 is a diagram illustrating wiring lines formed in a lower portion of the display panel illustrated in FIG. 2.

Note that as illustrated in FIG. 2, the width of the second corner portion 12b of the display panel 10 is substantially the same as the width of the first corner portion 12a. However, as illustrated in FIG. 3, wiring lines for supplying drive signals from the outside to the scanning circuits 51 and the emission circuits 61 needs to be arranged in the third corner portion 12c and the fourth corner portion 12d. Thus, the widths of the third corner portion 12c and the fourth corner portion 12d are wider than the widths of the first corner portion 12a and the second corner portion 12b.

FIG. 3 is a diagram illustrating wiring lines formed in the lower portion of the display panel 10. As illustrated in FIG. 3, a circuit substrate 16 is connected in which a terminal portion 18 is provided on the lower portion of the display panel 10 having terminals for connecting m data lines extending from the data line drive circuit 30 provided outside the display panel 10 to m data lines formed in the display region 15. An inspection circuit 17 for inspecting actions of the display panel 10, wiring lines for supplying drive signals to the scanning circuits and the emission circuits arranged in the frame 11, or the like are also formed in the circuit substrate 16. Note that the circuit substrate 16 may be a flexible circuit substrate.

1.3 Scanning Circuit

Figure 4:
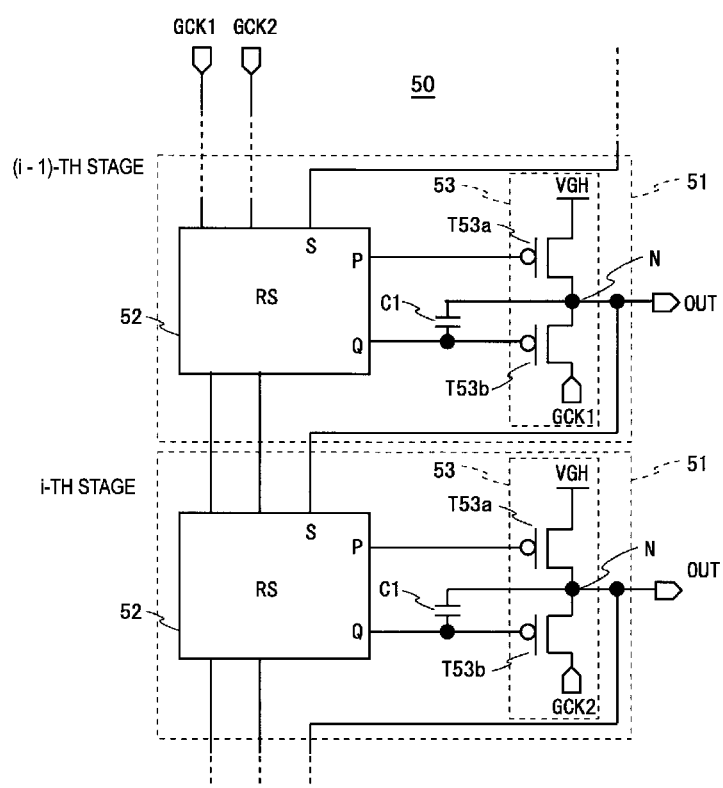
FIG. 4 is a block diagram illustrating a configuration of a scanning circuit included in the display device illustrated in FIG. 1.

FIG. 4 is a block diagram illustrating a configuration of a scanning circuit 51 included in the display device according to the present embodiment. The scanning line drive circuit 50 is constituted with n scanning circuits 51 (n is an integer of 1 or greater) connected in multiple stages. In FIG. 4, a scanning circuit 51 of the (i−1)-th stage (i is an integer such that $2 \leq i \leq n$), and a scanning circuit 51 at the i-th stage are illustrated among the scanning circuits. Hereinafter, the signal input and output via each terminal is referred to as the same name as the terminal. For example, a signal input from a clock terminal GCK1 is referred to as a clock signal GCK1.

Each of the scanning circuits 51 of the i-th stage and the (i−1)-th stage includes a known RS flip-flop circuit 52 and an output control circuit 53 connected to the RS flip-flop circuit 52. The RS flip-flop circuit 52 is provided with clock terminals GCK1 and GCK2, an input terminal S, and output terminals P and Q. The output control circuit 53 is a circuit in which two P-channel type transistors T53a and T53b are connected in series, and a gate terminal of the transistor T53a is connected to the output terminal P of the RS flip-flop circuit 52, and a source terminal of the transistor T53a is connected to a high-level power source line VGH. The transistor T53b includes a gate terminal of connected to the output terminal P of the RS flip-flop circuit 52, and a source terminal connected to a drain terminal of the transistor T53a.

Furthermore, a capacitance C1 is provided between the output terminal Q and a node N in which the drain terminal of the transistor T53a and the source terminal of the transistor T53b are connected. An output terminal OUT extending from the node N is connected to a corresponding scanning line and a subsequent input terminal S. Note that the clock terminal GCK1 is connected to the drain terminal of the transistor T53b of the (i−1)-th stage, and the clock terminal GCK2 is connected to a drain terminal of the transistor T53b of the i-th stage.

Figure 5:
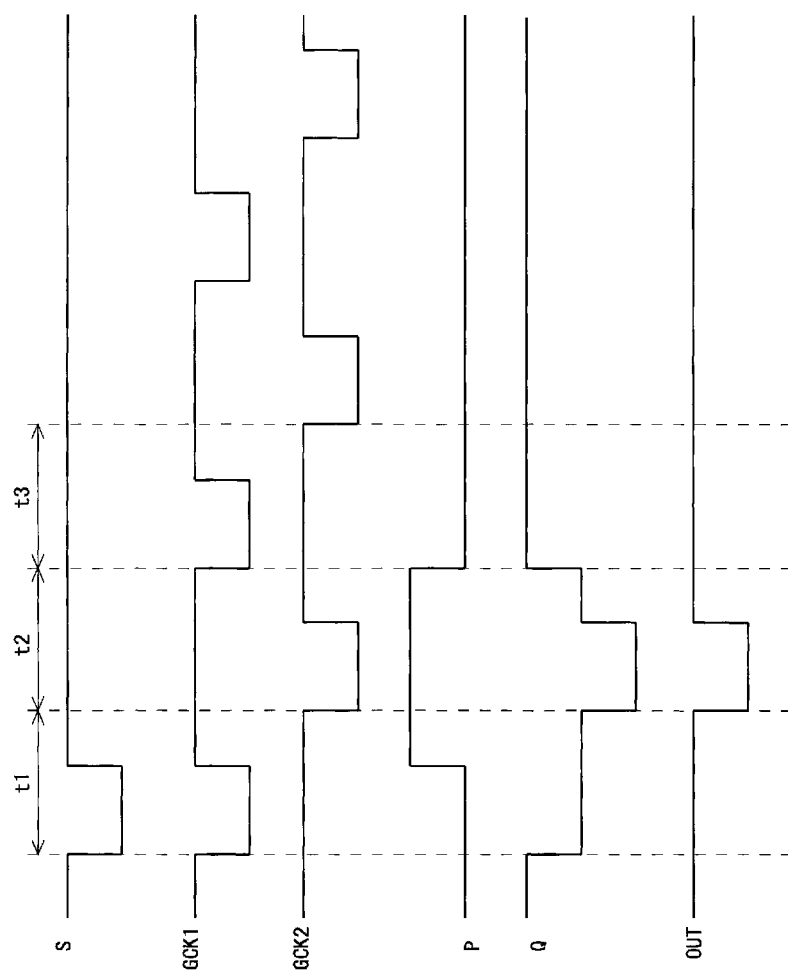
FIG. 5 is a timing chart of the scanning circuit illustrated in FIG. 4.

FIG. 5 is a timing chart of the scanning circuit 51 illustrated in FIG. 4. As illustrated in FIG. 5, in the first half of the time period t1, in a case where the input signal S at a low level is given to the RS flip-flop circuit 52 from the output terminal OUT of the scanning circuit 51 of the previous stage, and a clock signal GCK1 at a low level and a clock signal GCK2 at a high level are provided to the clock terminals GCK1 and GCK2 respectively, the RS flip-flop circuit 52 outputs an output signal P and an output signal Q at a low level. The output signal P is provided to the gate terminal of the transistor T53a, and the output signal Q is provided to the gate terminal of the transistor T53b. As a result, the transistor T53a is in an on state and the transistor T53b is in an off state, so the output signal OUT at a high level is output from the output control circuit 53.

In the latter half of the time period t1, in a case where the input signal S at a high level is given to the RS flip-flop circuit 52 from the scanning circuit 51 of the previous stage, and a clock signal GCK1 and a clock terminal GCK2 at a high level are provided to the clock terminals GCK1 and GCK2 respectively, the RS flip-flop circuit 52 outputs the output signal P at a high level and the output signal Q at a low level. As a result, the transistor T53a is in the off state and the transistor T53b is in the on state, so the output signal OUT at a high level is output from the output control circuit 53.

In the first half of the time period t2, in a case where the input signal S at a high level is given to the RS flip-flop circuit 52 from the scanning circuit 51 of the previous stage, and a clock signal GCK1 at a high level and a clock terminal GCK2 at a low level are provided to the clock terminals GCK1 and GCK2 respectively, the RS flip-flop circuit 52 outputs the output signal P at a high level and the output signal Q at a low level. As a result, the transistor T53a is in the off state and the transistor T53b is in the on state, so the output signal OUT at a low level is output from the output control circuit 53. As a result, a scanning line connected to the output terminal OUT of the scanning circuit 51 is selected, and pixel circuits connected to the scanning line are selected. Thus, the data signals are written from the data lines to the pixel circuits. Since the capacitance C1 functions as a bootstrap capacitance, the voltage applied to the gate terminal of the transistor T53b is a voltage lower than the output signal Q. Thus, the transistor T53b is able to output the clock signal GCK2 at a low level without changing the voltage level.

In the latter half of the time period t2, in a case where the input signal S at a high level is given to the RS flip-flop circuit 52 from the scanning circuit 51 of the previous stage, and clock signals GCK1 and GCK2 at a high level are provided to the clock terminals GCK1 and GCK2 respectively, the RS flip-flop circuit 52 outputs the output signal P at a high level and the output signal Q at a low level. As a result, the transistor T53a is in the off state and the transistor T53b is in the on state, so the output signal OUT at a high level is output from the output control circuit 53.

In the first half of the time period t3, in a case where the input signal S at a high level is given to the RS flip-flop circuit 52 from the scanning circuit 51 of the previous stage, and a clock signal GCK1 at a low level and a clock signal GCK2 at a high level are provided to the clock terminals GCK1 and GCK2 respectively, the RS flip-flop circuit 52 outputs the output signal P at a low level and the output signal Q at a high level. As a result, the transistor T53a is in the on state and the transistor T53b is in the off state, so the output signal OUT at a high level is output from the output control circuit 53.

In the same manner as well in the latter half of the time period t3, the transistor T53a is in the on state and the transistor T53b is in the off state, so the output signal OUT at a high level is output from the output control circuit 53. In the same manner as well in the following periods, the output signal OUT at a high level is output. In this way, in a case where the output signal OUT at a high level is output, the pixel circuits connected to the scanning line corresponding to the output terminal OUT are not selected, so the data signals are not written to the pixel circuits.

1.4 Emission Circuit

Figure 6:
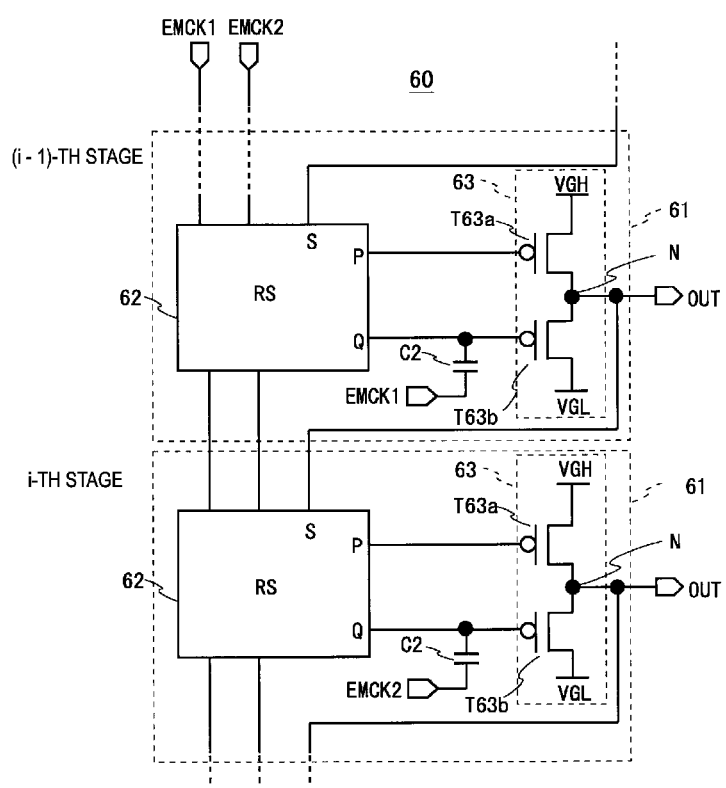
FIG. 6 is a block diagram illustrating a configuration of an emission circuit included in the display device illustrated in FIG. 1.

The emission circuit will now be described. FIG. 6 is a block diagram illustrating a configuration of an emission circuit 61 included in the display device according to the present embodiment. The light emission control line drive circuit 60 is constituted with n emission circuits 61 connected in multiple stages, and in FIG. 6, an emission circuit 61 at the (i−1)-th stage and an emission circuit 61 at the i-th stage are illustrated among the emission circuits.

The configuration of the emission circuit 61 illustrated in FIG. 6 is similar to that of the scanning circuit 51 illustrated in FIG. 4, and thus will be mainly described with respect to different configurations. As illustrated in FIG. 6, the emission circuit 61 also includes a known RS flip-flop circuit 62 and an output control circuit 63 connected to the RS flip-flop circuit 62. The RS flip-flop circuit 62 is provided with clock terminals EMCK1 and EMCK2. Each of drain terminals of the two transistors T63a and T63b constituting the output control circuit 63 is connected to a low-level power source line VGL, and a capacitance C2 is connected at one end to a gate terminal of the transistor T63b. In this way, the output control circuit 63 can stably output the output signal OUT at a low level. The other end of the capacitance C2 of the (i−1)-th stage is connected to a clock terminal EMCK1, and the other end of the capacitance C2 of the i-th stage is connected to a clock terminal EMCK2.

Figure 7:
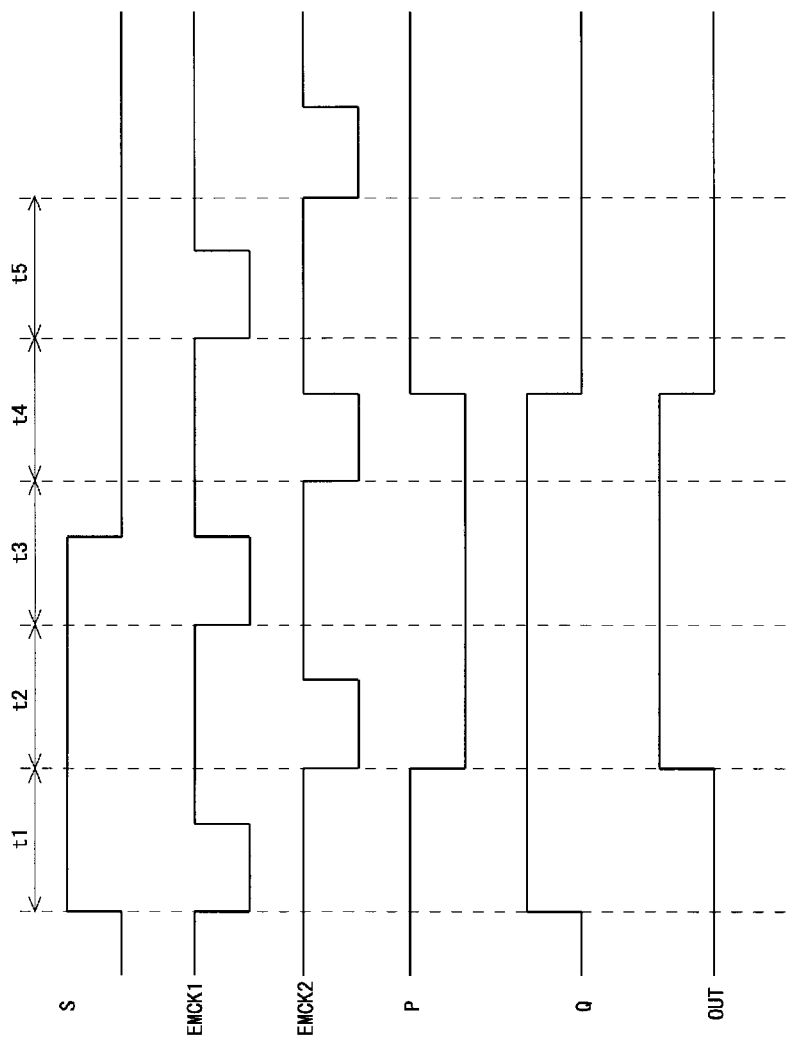
FIG. 7 is a timing chart of the emission circuit illustrated in FIG. 6.

FIG. 7 is a timing chart of the emission circuit 61 illustrated in FIG. 6. As illustrated in FIG. 7, in the first half of the time period t1, the input signal S at a high level is given to the RS flip-flop circuit 62 from the emission circuit 61 of the previous stage, and a clock signal EMCK1 at a low level and a clock terminal EMCK2 at a high level are provided to the clock terminals EMCK1 and EMCK2 respectively. The RS flip-flop circuit 62 outputs the output signal P at a high level and the output signal Q at a low level. The output signal P is provided to a gate terminal of the transistor T63a, and the output signal Q is provided to the gate terminal of the transistor T63b. As a result, the transistor T63a is in the off state and the transistor T63b is in the on state, so the output signal OUT at a low level is output from the output control circuit 63.

In the latter half of the time period t1, in a case where the input signal S at a high level is given to the RS flip-flop circuit 62, and the clock signals EMCK1 and EMCK2 at a high level are provided to the clock terminals EMCK1 and EMCK2 respectively, the RS flip-flop circuit 62 outputs the output signal P at a high level and the output signal Q at a low level. As a result, the transistor T63a is in the off state and the transistor T63b is in the on state, so the output signal OUT at a low level is output from the output control circuit 63.

In the first half of the time period t2, in a case where the input signal S at a high level is given to the RS flip-flop circuit 62, and the clock signal EMCK1 at a high level and the clock terminal EMCK2 at a low level are provided to the clock terminals EMCK1 and EMCK2 respectively, the RS flip-flop circuit 62 outputs the output signal P at a low level and the output signal Q at a high level. As a result, the transistor T63a is in the on state and the transistor T63b is in the off state, so the output signal OUT at a high level is output from the output control circuit 63.

In the latter half of the time period t2, in a case where the input signal S at a high level is provided to the RS flip-flop circuit 62, and the clock signals EMCK1 and EMCK2 at a high level are provided to the clock terminals EMCK1 and EMCK2 respectively, the output signal P at a low level and the output signal Q at a high level are output. As a result, the transistor T63a is in the on state and the transistor T63b is in the off state, so the output signal OUT at a high level is output from the output control circuit 63.

In the first half of the time period t3, in a case where the input signal S at a high level is given to the RS flip-flop circuit 62, and the clock signal EMCK1 at a low level and the clock signal EMCK2 at a high level are provided, the RS flip-flop circuit 62 outputs the output signal P at a low level and the output signal Q at a high level. As a result, the transistor T63a is in the on state and the transistor T63b is in the off state, so the output signal OUT at a high level is output from the output control circuit 63.

In the latter half of the time period t3 and the latter half of the time period t4, the output signal OUT at a high level is output in the same manner as in the latter half of the time period t2, and in the first half of the time period t4, the output signal OUT at a high level is output in the same manner as in the first half of the time period t2. In the first half of the time period t5, the output signal OUT at a low level is output in the same manner as in the first half of the time period t1, and in the latter half of the time period t5, the output signal OUT at a low level is output in the same manner as in the latter half of the time period t1. Hereinafter, in a case where the output signal OUT at a low level is output in the same manner, a corresponding light emission control line is selected, and a transistor (not illustrated) connected to the organic EL display elements in the pixel circuit is in the on state. As a result, in the periods after the time period t5, a drive current flows to the organic EL display elements, and the organic EL display elements emit light.

Figure 8:
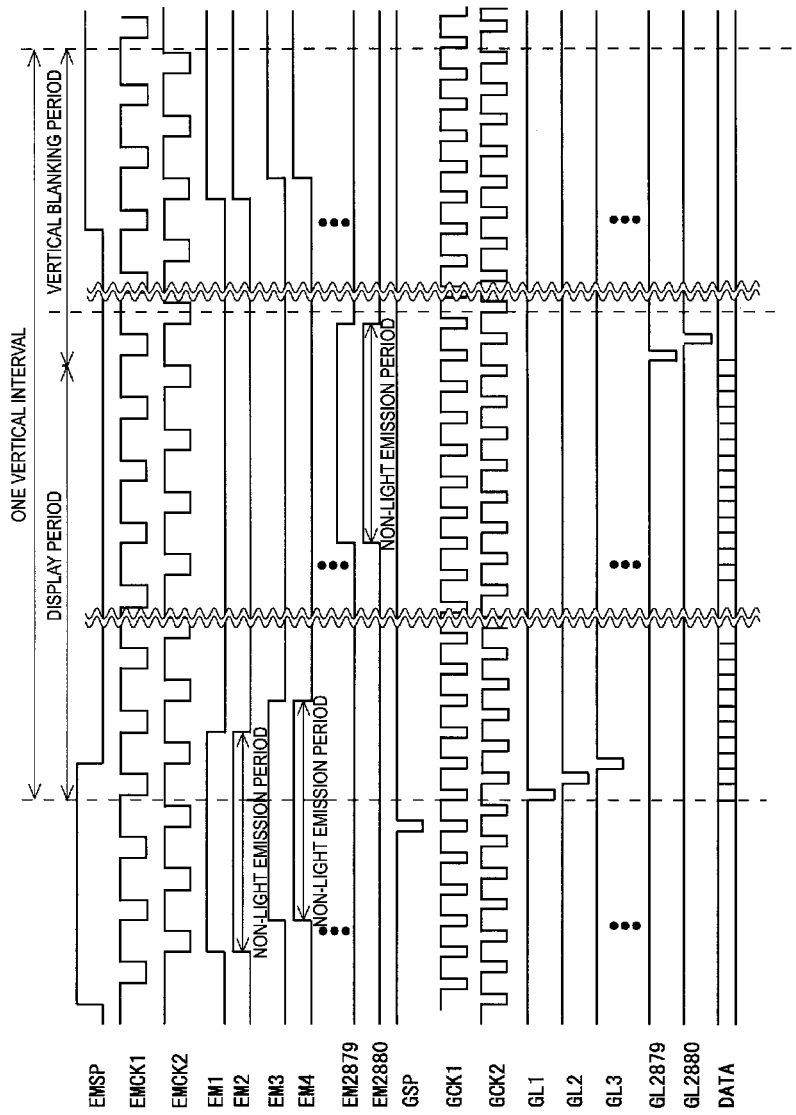
FIG. 8 is a timing chart illustrating actions of the display device illustrated in FIG. 1.

FIG. 8 is a timing chart illustrating the actions of the display device according to the present embodiment. As illustrated in FIG. 8, one vertical interval includes a display interval followed by a vertical blanking period. The timings in which the potentials of the scanning lines GL1 to GLn are sequentially set to the low level in accordance with the clock signals GCK1 and GCK2 are illustrated in the lower part of the timing chart. At the timing when the scanning line is at a low level, data signals are provided to corresponding data lines, so the data signals are written from the data lines to the pixel circuits to which the scanning line provided with a scanning signal at a low level is connected. In this way, the data signals are sequentially written to the pixel circuits connected to each scanning line. Note that the relationship between the clock signals GCK1 and GCK2 and the output signal of the scanning circuit 51 has been described in the timing chart illustrated in FIG. 5, and detailed description thereof is omitted here.

In the upper part of the timing chart, the timings in which the potentials of the light emission control lines EM1 to EMn are sequentially set to the high level in accordance with the clock signals EMCK1 and EMCK2 are illustrated. In this case, a drive current does not flow to the organic EL display elements of the pixel circuit by providing a light emission control signal at a high level to the light emission control line before a scanning signal at a low level is provided to the scanning line. In this way, this period is a non-light emission period.

Subsequently, after the data signals are written to the pixel circuits, a light emission control signal at a low level is provided to the light emission control line. As a result, the current corresponding to the data signals flows to the organic EL display elements, and the organic EL display elements emit light at a gray scale corresponding to the data signals. Thereafter, the potential of the light emission control line maintains the potential at the low level until the blanking period, and thus the organic EL display elements continue to emit light until the vertical blanking period. Note that since the potential of the light emission control line changes from the high level to the low level per two lines, each pixel circuit connected to the two light emission control lines emits light sequentially, and continues to emit light until the vertical blanking period. Note that the relationship between the clock signals EMCK1 and EMCK2 and the output signal from the emission circuit has been described in the timing chart illustrated in FIG. 7, and detailed description thereof is omitted here.

1.5 Arrangement of Scanning Circuit and Emission Circuit

1.5.1 Arrangement in Comparative Example

Figure 9:
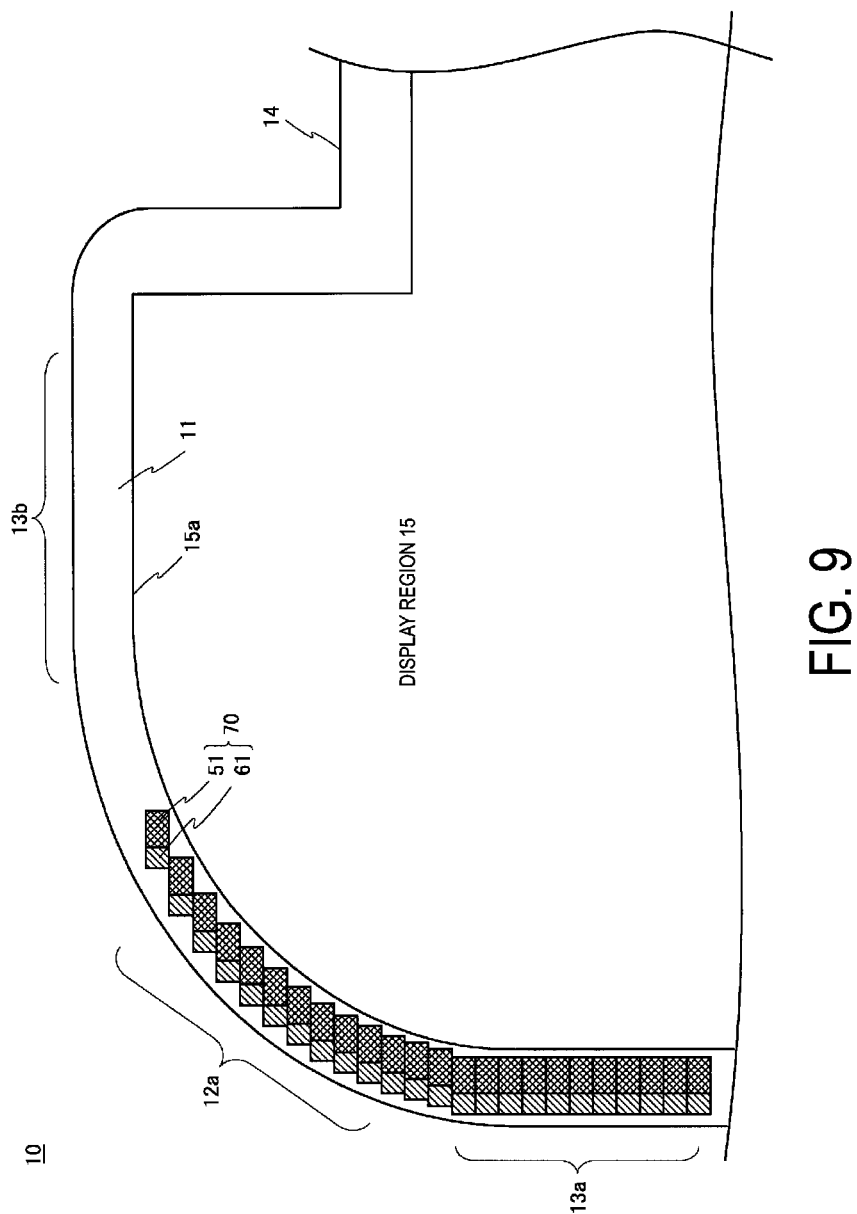
FIG. 9 is a diagram illustrating a portion of a display panel in which scanning circuits and emission circuits are arranged in a comparative example of the first embodiment.

FIG. 9 is a diagram illustrating a portion of a display panel in which the scanning circuits 51 and the emission circuits 61 are arranged in a comparative example of the present embodiment. The display panel 10 illustrated in FIG. 9 is an enlarged view of the second side 13b, the first side 13a, and the first corner portion 12a sandwiched therebetween of the display panel 10 illustrated in FIG. 2. Note that in the following description, a scanning circuit that provides a scanning signal and an emission circuit that provides a light emission control signal to pixel circuits connected to the same scanning signal line may be referred to as an "emission circuit corresponding to a scanning circuit" or a "scanning circuit corresponding to an emission circuit".

As illustrated in FIG. 9, since the first side 13a of the display panel 10 is a straight line region, unit circuit blocks 70, each including a scanning circuit 51 and an emission circuit 61 arranged in series, are arranged by layering in the length direction of the first side 13a. The scanning circuit 51 included in each unit circuit block 70 is arranged on the outer peripheral edge 15a side of the display region 15, and each emission circuit 61 is arranged in series outside the corresponding scanning circuit 51. Each unit circuit block 70 is arranged parallel to the direction in which the scanning lines extend.

In contrast, the first corner portion 12a is a curved line region, and similar to the case of the first side 13a, the scanning circuits 51 are arranged along the outer peripheral edge 15a of the display region 15, and the emission circuits 61 are arranged in series outside the corresponding scanning circuits 51. In other words, the unit circuit blocks 70 including the scanning circuits 51 and the emission circuits 61 are arranged so as to be sequentially shifted in a stepwise manner to the display region 15 side for each unit circuit block 70. By arranging the unit circuit blocks 70 in this manner, the width of the first corner portion 12a can be made narrower. However, because the length of the unit circuit blocks 70 is long, there is a problem that the width of the first corner portion 12a cannot be narrowed. Note that in FIG. 9, the unit circuit blocks 70 arranged on the first side 13a and the first corner portion 12a are illustrated, and similarly, the unit circuit blocks 70 may be arranged on the third side 13c and the second corner portion 12b as well.

1.5.2 Arrangement in the Present Embodiment

Figure 10:
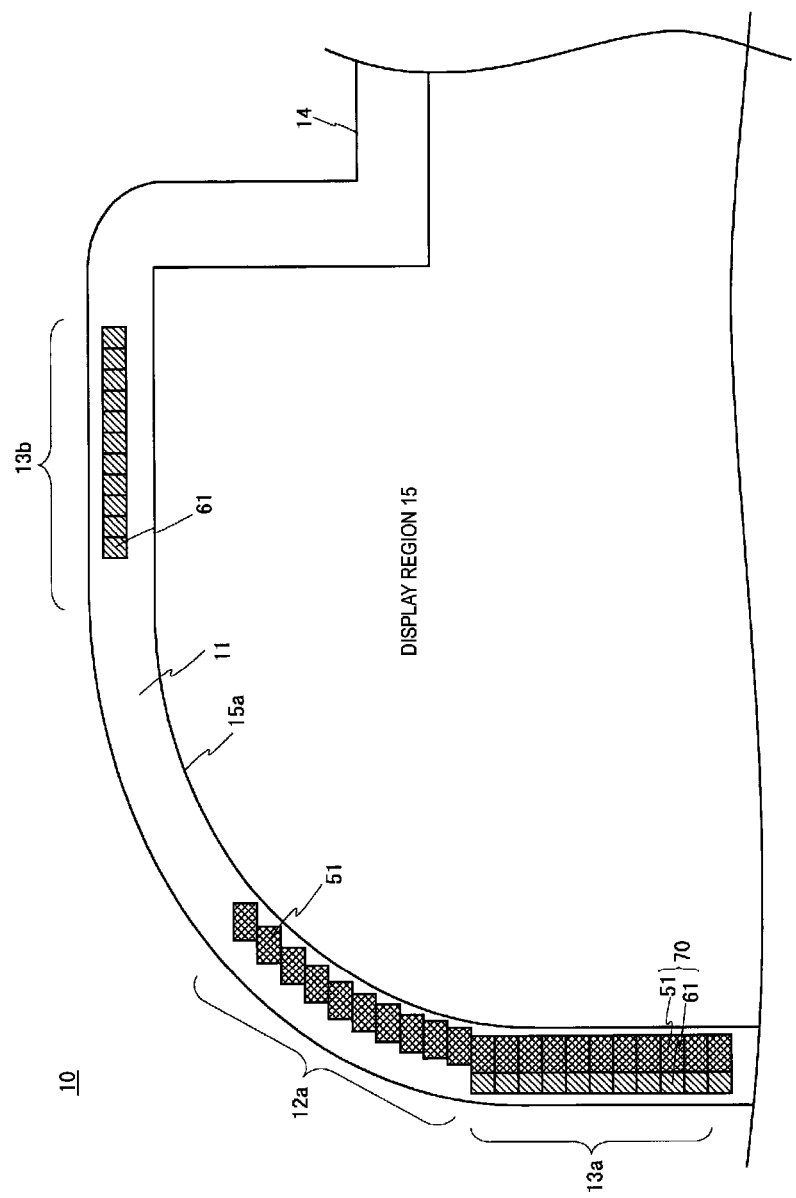
FIG. 10 is a diagram illustrating a portion of a display panel in which scanning circuits and emission circuits are arranged in the first embodiment.

FIG. 10 is a diagram illustrating the display panel 10 in which the scanning circuits 51 and the emission circuits 61 are arranged in the display device according to the present embodiment. As illustrated in FIG. 10, a method of arranging the scanning circuits 51 and the emission circuits 61 on the first side 13a of the display panel 10 is the same as that of the comparative example illustrated in FIG. 9, and thus descriptions thereof will be omitted.

In contrast, in the first corner portion 12a, the scanning circuits 51 and the emission circuits 61 are separated, and only the scanning circuits 51 are arranged so as to be sequentially shifted in a stepwise manner to the display region 15 side along the outer peripheral edge 15a of the display region 15 of the first corner portion 12a, and each emission circuit 61 corresponding to the respective scanning circuits 51 are arranged in a row on the second side 13b.

As a result, only the scanning circuits 51 are arranged in the first corner portion 12a, so that it is possible to narrow the width of the first corner portion 12a. Note that each of the scanning circuits 51 in the first corner portion 12a is preferably arranged so that the distance to the outer peripheral edge is approximately 10 to 20 µm, for example.

Figure 11:
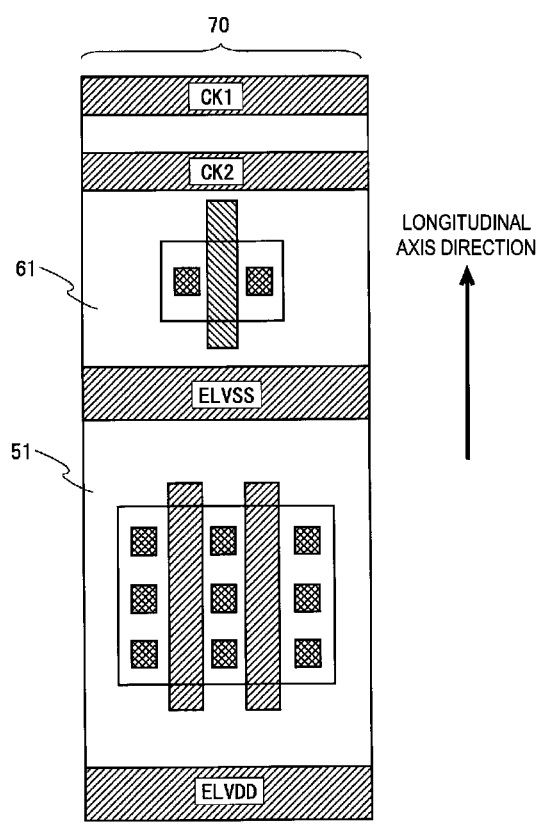
FIG. 11 is a diagram illustrating a configuration of a unit circuit block.

A method of arranging the scanning circuits 51 in the first corner portion 12a will be described. FIG. 11 is a diagram illustrating a configuration of the unit circuit block 70. As illustrated in FIG. 11, the unit circuit block 70 is a circuit in which the scanning circuit 51 and the emission circuit 61 having a rectangular shape are arranged in series. In the first corner portion 12a, instead of unit circuits, only the scanning circuits 51 having a rectangular shape are arranged. The scanning circuits 51 are arranged in a stepwise manner on the first corner portion 12a along the outer peripheral edge 15a of the display region 15. At this time, since the scanning circuits 51 have a rectangular shape, the scanning circuits 51 are arranged so that one side is parallel with the extending direction of the scanning lines. In the first side 13a, the unit circuit blocks 70 are arranged so that the longitudinal axis direction thereof is parallel to the extending direction of the scanning lines. Note that even in a case where the emission circuits 61 are arranged in a stepwise manner along the outer peripheral edge 15a instead of the scanning circuits 51, the emission circuits 61 are arranged in the same manner as in the case of the scanning circuits 51. While each of the scanning circuits 51 and the emission circuits 61 is constituted with a plurality of TFTs (thin film transistors), only some of the transistors are described in FIG. 11.

Figure 12:
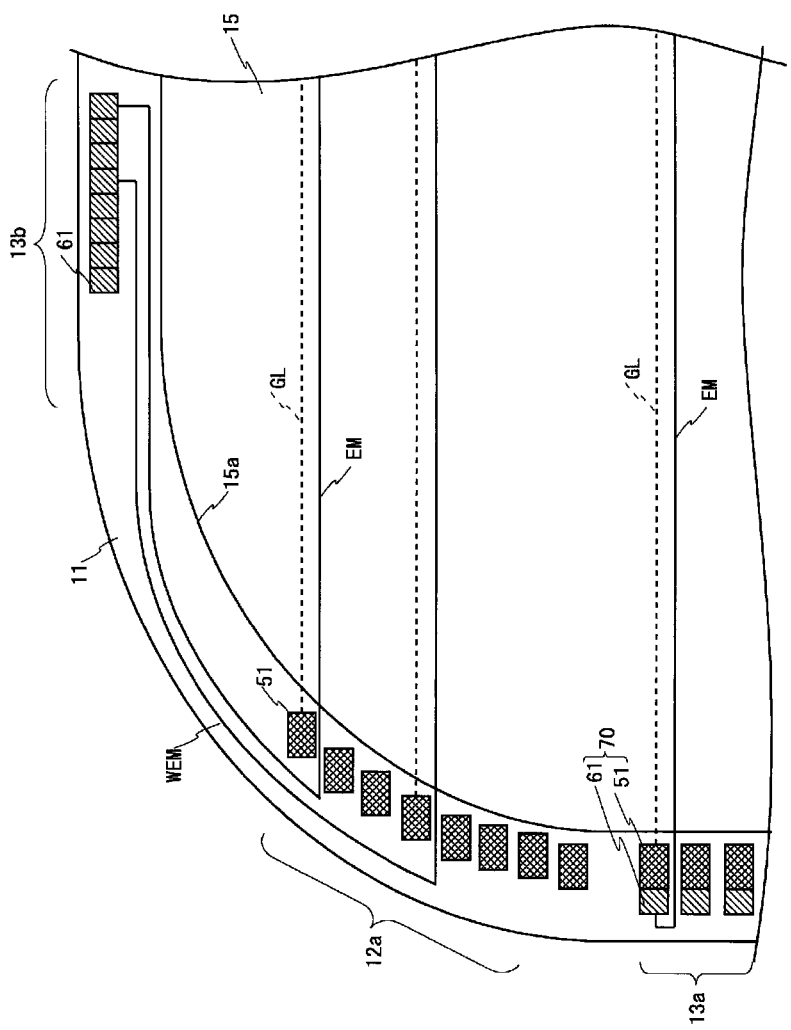
FIG. 12 is a diagram illustrating a portion of wiring lines for connecting the scanning circuits arranged on a frame of the display panel illustrated in FIG. 10 to scanning lines and connecting the emission circuits to light emission control lines.

FIG. 12 is a diagram illustrating a portion of wiring lines for connecting the scanning circuits 51 arranged in the frame 11 of the display panel 10 illustrated in FIG. 10 to the scanning lines, and a portion of wiring lines for connecting the emission circuits 61 to the light emission control lines. As illustrated in FIG. 12, a wiring line extending from a scanning circuit 51 arranged on the first side 13a is connected to a scanning line GL of the display region 15. A wiring line extending from an emission circuit 61 is connected to a light emission control line EM of the display region 15 through a gap provided between the corresponding scanning circuit 51 and an adjacent scanning circuit 51.

A wiring line extending from a scanning circuit 51 arranged in the first corner portion 12a is connected to a scanning line GL of the display region 15. A wiring line WEM extending from an emission circuit 61 arranged on the second side 13b extends along the outer circumference of the second side 13b to the first corner portion 12a. Furthermore, the wiring line WEM is connected to a light emission control line EM of the display region 15 through a gap provided between the corresponding scanning circuit 51 and an adjacent scanning circuit 51. In this case, the width of the first corner portion 12a can be narrowed by arranging only the scanning circuits 51 in the first corner portion 12a and arranging the emission circuits 61 in a row on the second side 13b. Note that, in the present embodiment, the reason why the scanning circuits 51 are arranged in the first corner portion 12a near the end portions of the scanning lines, and the emission circuits 61 are arranged on the second side 13b separated from the light emission control lines is that the light emission control signals output from the emission circuits 61 have a margin of drive timing compared to the scanning signals, so there is less influence on the drive timing even in a case where the signals are delayed due to the length of the wiring lines being longer.

In the description described above, a case in which the scanning circuits 51 are arranged in the first corner portion 12a is described. However, the scanning circuits 51 may also be arranged in the fourth corner portion 12d, or may be arranged in only the fourth corner portion 12d without being arranged in the first corner portion 12a.

Figure 13:
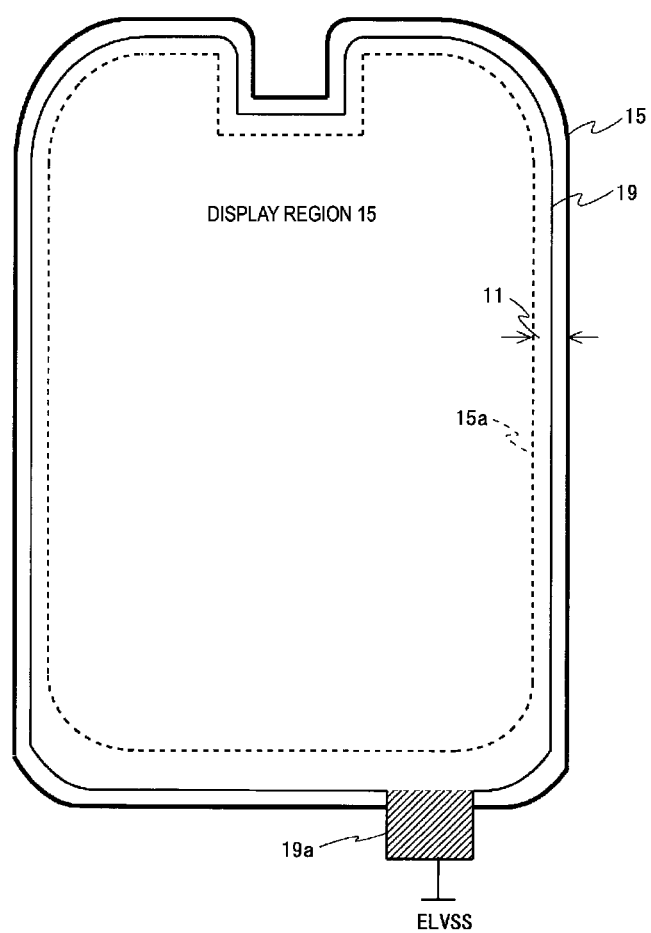
FIG. 13 is a diagram illustrating a configuration of a cathode of organic EL display elements formed on the display panel of the first embodiment.

FIG. 13 is a diagram illustrating a configuration of a cathode 19 of organic EL display elements formed on the display panel 10 of the present embodiment. As illustrated in FIG. 13, the cathode (cathode electrode) 19 of the organic EL display elements included in each pixel circuit is constituted of a single metal film formed so as to cover all of the display region 15 of the display panel 10 and an upper face of a portion of the frame 11 close to the display region 15. More specifically, the cathode 19 is formed so as to overlap only with the scanning circuits 51 arranged along the outer peripheral edge 15a in the first side 13a and so as not to overlap with the emission circuits 61 arranged outside the scanning circuits 51. In the first corner portion 12a, the cathode 19 is formed so as to overlap with the scanning circuits 51 arranged along the outer peripheral edge 15a. The shape of the cathode 19 in the other sides and corner portions is the same. In this way, the cathode 19 is formed so as to overlap with the display region 15 and the scanning circuits 51 with an insulating film 19c interposed therebetween in the frame 11.

Note that, for example, in the first side 13a, in a case where the emission circuits 61 are arranged along the outer peripheral edge 15a, and the scanning circuits 51 are arranged outside the emission circuits 61, the cathode 19 is formed so as to overlap with the display region 15 and the emission circuits 61. On the sides in which the scanning circuits and the emission circuits are arranged such as in the first side 13a, the cathode 19 may be formed so as to not only overlap with the display region 15 and the scanning circuits 51, but also overlap with the emission circuits 61.

A connection terminal 19a extending to the outside is formed on the lower end of the cathode 19. By connecting the connection terminal 19a to a low-level drive voltage line ELVSS, the potential of the cathode 19 can be set to the low level. As a result, by simply forming the cathode 19 with a single metal film, the cathode of all organic EL display elements can be easily formed. By simply providing a predetermined potential to the connection terminal 19a, the potential of the entire cathode 19 can be made the same at the same time.

1.6 Effects

According to the present embodiment, in the display panel 10 having an irregular shape, the scanning circuits 51 and the emission circuits 61 are separated, and the scanning circuits 51 are arranged in the first corner portion 12a of the display panel 10 to be shifted to the direction that the scanning lines extend along the outer peripheral edge 15a of the display region 15, and the emission circuits 61 are arranged in a row on the second side 13b. As a result, the width of the first corner portion 12a can be made narrower and thus the frame of the display panel 10 having an irregular shape can be made narrower.

The cathode 19 of the organic EL display elements included in respective pixel circuits is constituted with a single metal film formed so as to cover the display region 15 and the frame 11 of the display panel 10. By connecting the connection terminal 19a formed in part with the same metal film as the cathode 19 to low-level drive voltage line ELVSS, the potential of the cathode 19 of each pixel circuit can be simultaneously set to the low level. In this way, by simply forming a single metal film on the display panel 10, the cathode 19 of all of the organic EL display elements can be easily formed.

1.7 Modified Example of Arrangement of Scanning Circuit and Emission Circuit

1.7.1 First Modified Example

In the display panel 10 of the above-described embodiment, as illustrated in FIG. 10, only the scanning circuits 51 are arranged in the first corner portion 12a along the outer peripheral edge 15a of the display region 15, and the corresponding emission circuits 61 are arranged in a row on the second side 13b. However, only the emission circuits 61 may be arranged along the outer peripheral edge 15a of the first corner portion 12a, and the scanning circuits 51 corresponding thereto may be arranged on the second side 13b. In this case, in the first side 13a as well, the scanning circuits 51 and the emission circuits 61 are reversely arranged, specifically the emission circuits 61 are arranged on the display region 15 side, and the scanning circuits 51 are arranged on the outer side. As a result, similar to the case of the above-described embodiment, the width of the first corner portion 12a can be made as narrow as the width of the first side 13a. Note that the drive timing of the scanning signals output from the scanning circuits 51 arranged on the second side 13b tends to be shifted because the length of the wiring lines increases, so it is preferable to make the length of the wiring line as short as possible.

1.7.2 Second Modified Example

The scanning circuits 51 and the emission circuits 61 may be alternately arranged in the first corner portion 12a along the outer peripheral edge 15a of the display region 15. In this case as well, similar to the case of the present embodiment, the width of the first corner portion 12a can be made narrower. Note that, in addition to the case of alternately replacing arrangement of the scanning circuits 51 and the emission circuits 61 arranged in the first corner portion 12a as described above, arranging a plurality of the scanning circuits 51 along the outer peripheral edge 15a and then arranging a plurality of the emission circuits 61 may be repeated.

1.7.3 Third Modified Example

Figure 14:
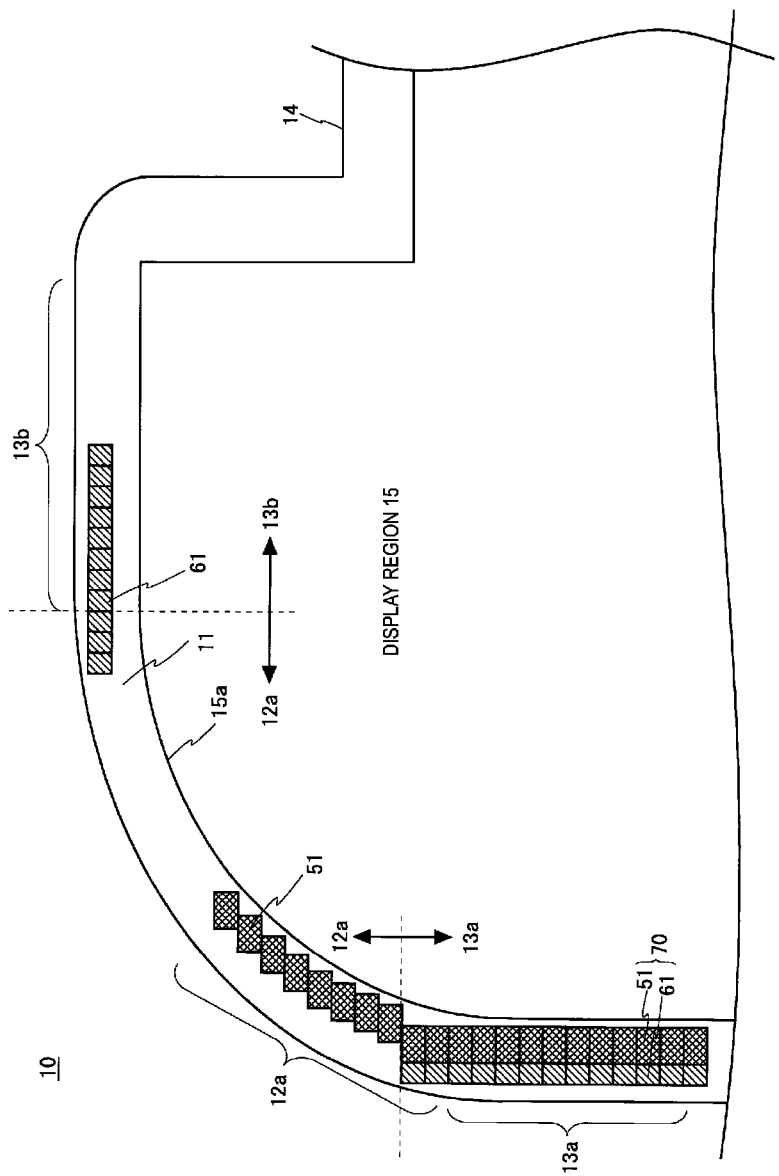
FIG. 14 is a diagram illustrating a portion of a display panel according to a third modified example of the first embodiment.

FIG. 14 is a diagram illustrating a portion of a display panel 10 according to a third modified example of the present embodiment. In the first embodiment, the unit circuit blocks 70 in which the scanning circuits 51 and the emission circuits 61 are arranged in series are arranged on the first side 13a, and only the scanning circuits 51 are arranged in the first corner portion 12a. However, even in a case where the unit circuit blocks 70 are not completely changed to the scanning circuits 51 at the boundary between the first side 13a and the first corner portion 12a, there is little influence for making the frame of the display panel 10 to be narrower. Thus, as illustrated in FIG. 14, in the vicinity of the region of the first corner portion 12a adjacent to the first side 13a, a plurality of the unit circuit blocks 70 may be arranged along the outer peripheral edge 15a in a similar manner to the case of the first side 13a, and then only the scanning circuits 51 may be arranged along the outer peripheral edge 15a. In this way, the unit circuit blocks 70 including the scanning circuits 51 and the emission circuits 61 may be arranged in a region of the first corner portion 12a near the first side 13a.

Similarly, even in a case where the scanning circuits 51 are not completely changed to the emission circuits 61 at the boundary changing from the first corner portion 12a to the second side 13b, there is little influence for making the frame of the display panel 10 to be narrower. Thus, as illustrated in FIG. 14, in the vicinity of a region of the first corner portion 12a adjacent to the second side 13b, some of the emission circuits 61 to be arranged on the second side 13b may be arranged in the first corner portion 12a, and the remaining emission circuits 61 may be arranged on the second side 13b. The description of the present modification is applicable not only to the case of the first embodiment, but also to other embodiments and other modified examples.

1.7.4 Fourth Modified Example

Figure 15:
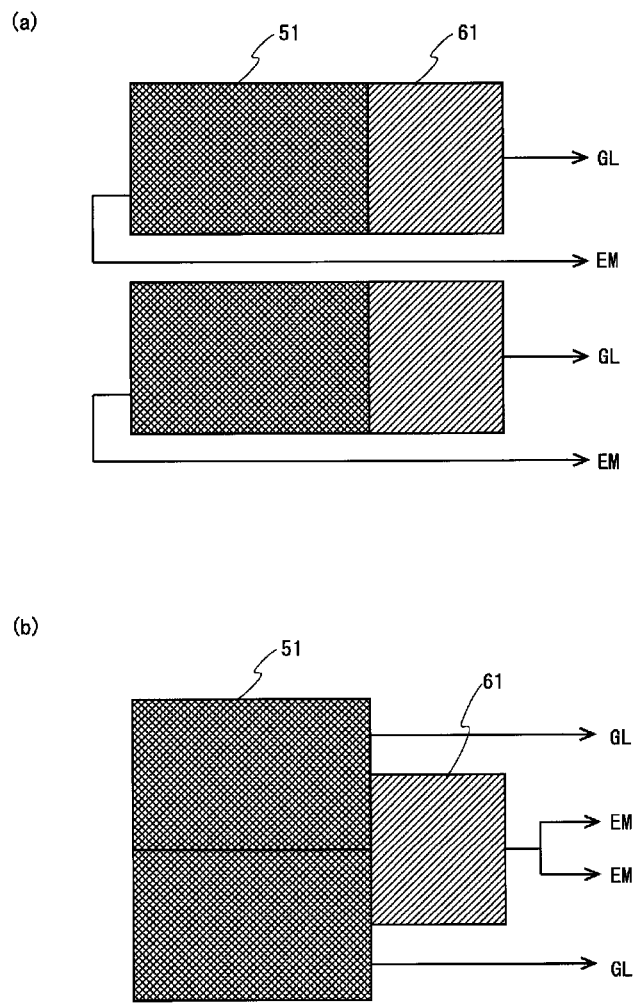
FIG. 15 is a block diagram illustrating scanning circuits and emission circuits arranged on a first side of the display panel of the first embodiment, and more particularly, (a) is a block diagram illustrating an arrangement in which positions of the scanning circuits and the emission circuits are replaced with each other on the first side illustrated in FIG. 10, and (b) is a block diagram illustrating an arrangement of the scanning circuits and the emission circuits on the first side of the third modified example.

FIG. 15 is a block diagram illustrating the arrangement of the scanning circuits 51 and the emission circuits 61 arranged on the first side 13a of the display panel 10, and more specifically, FIG. 15(a) is a block diagram illustrating the inverse arrangement of the scanning circuits 51 and the emission circuits 61 on the first side 13a illustrated in FIG. 10, and FIG. 15(b) is a block diagram illustrating the arrangement of the scanning circuits 51 and the emission circuits 61 on the first side 13a of the present modified example. As illustrated in FIG. 15(a), the scanning circuits 51 and the emission circuits 61 are arranged in series in the horizontal direction on the first side 13a. In this case, as can be seen from the timing chart illustrated in FIG. 8, each of two adjacent emission circuits 61 outputs a light emission control signal at the same timing, and each of the scanning circuits 51 output scanning signals at different timings.

Thus, as illustrated in FIG. 15(b), two emission circuits 61 that output the same light emission control signal are replaced with one emission circuit, and a wiring line connected to the output terminal of the emission circuit 61 is branched into two wiring lines. At this time, the width of the emission circuit 61 is narrower than the width of the two scanning circuits 51. As a result, the two wiring lines extending from each of the scanning circuits 51 can be arranged so as to sandwich the two wiring lines that are branched from the wiring line extending from the emission circuit 61. In this way, the need to provide a gap for routing the wiring line from the emission circuit 61 between the adjacent scanning circuits 51 is eliminated. As a result, the area on which the scanning circuits 51 are arranged is reduced, so the frame of the display panel 10 can be made narrower.

1.7.5 Fifth Modified Example

Figure 16:
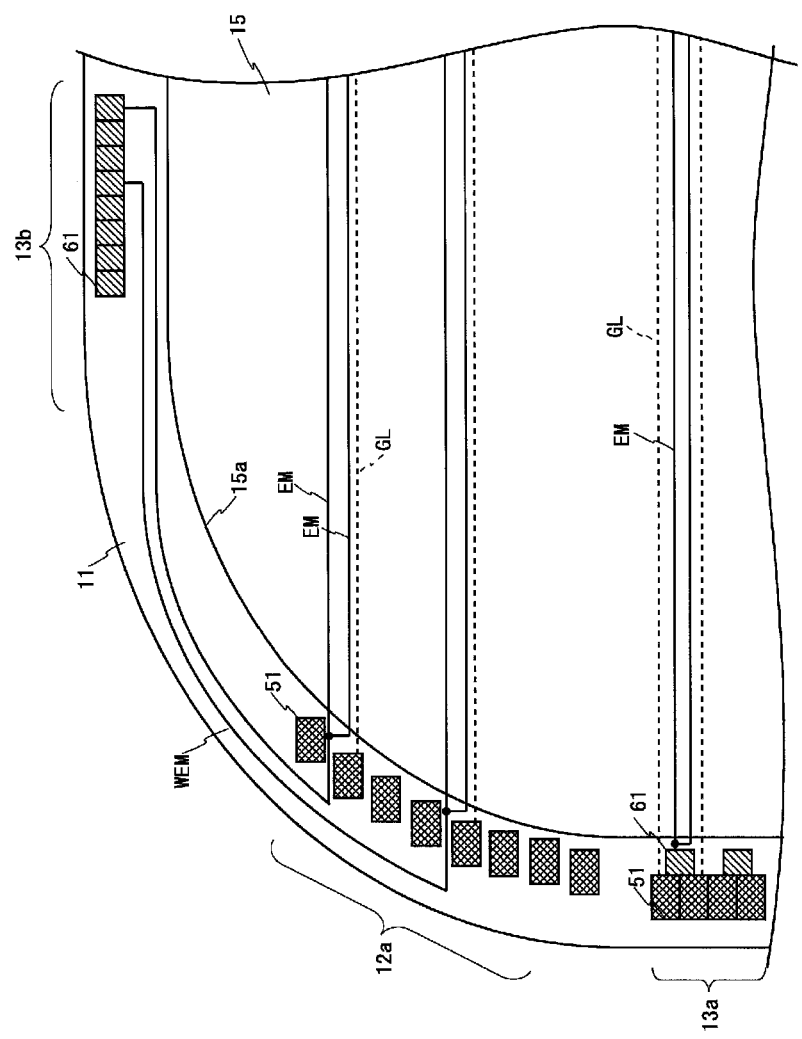
FIG. 16 is a diagram illustrating a portion of a display panel according to a fifth modified example of the present embodiment.

FIG. 16 is a diagram illustrating a portion of a display panel 10 according to a fifth modified example of the present embodiment. As illustrated in FIG. 16, a wiring line WEM extending from each of the emission circuits 61 arranged on the second side 13b is branched into two wiring lines at the first corner portion 12a, and each of the branched wiring lines is connected to a light emission control line EM formed in the display region 15. In this way, the number of wiring lines WEM extending from the emission circuits 61 arranged on the second side 13b to the first corner portion 12a is half the number of the emission circuits 61 arranged on the second side 13b, so the width of the first corner portion 12a can be made narrower. As a result, the frame of the display panel 10 can be made narrower. Note that a wiring line extending from each of the emission circuits 61 arranged on the first side 13a is also branched into two wiring lines, and each of the branched wiring lines is connected to a light emission control line EM. In contrast, a wiring line extending from each of the scanning circuits 51 arranged on the first corner portion 12a and the first side 13a is connected to each of the scanning lines GL without being branched. Note that the wiring line WEM extending from each of the emission circuits 61 may be branched into three or more wiring lines at the first corner portion 12a.

2. Second Embodiment

The configuration, the actions, and the display panel having an irregular shape used in the display device according to a second embodiment are the same as those of the first embodiment, and thus descriptions thereof will be omitted.

Figure 17:
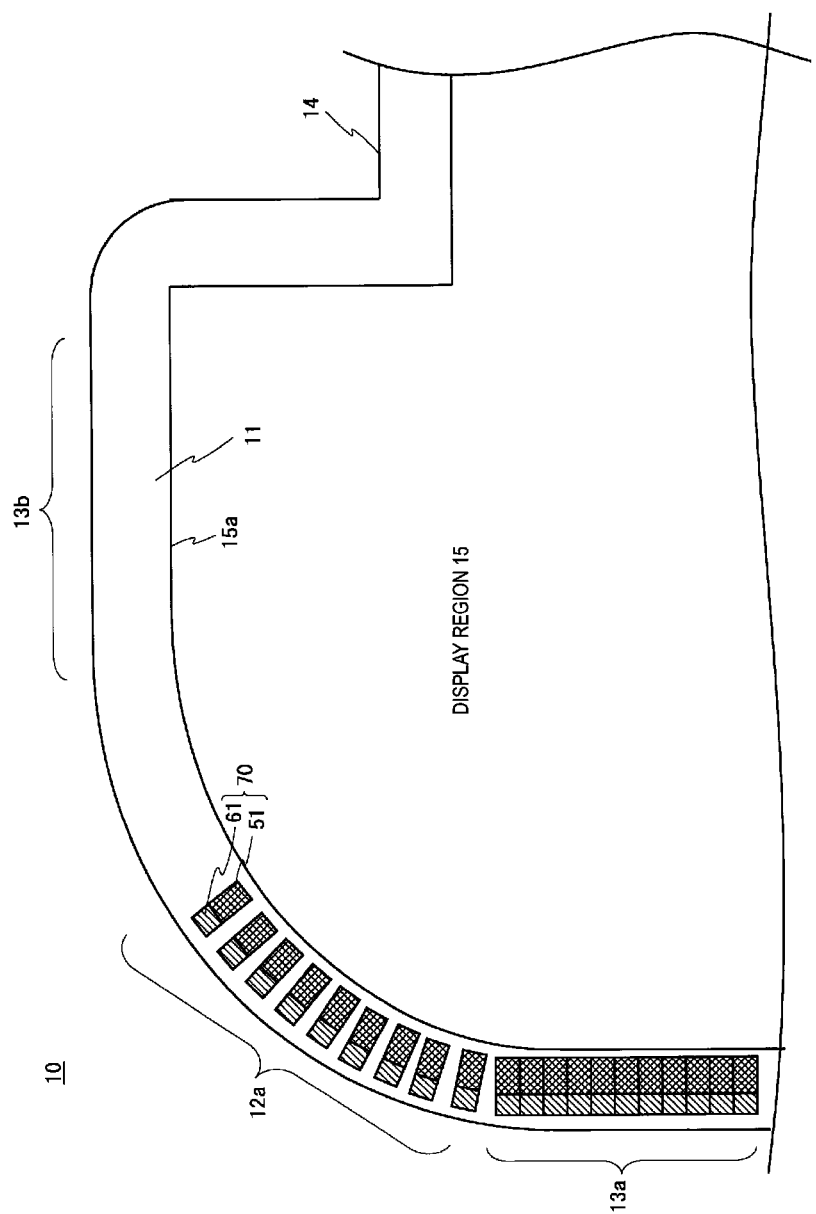
FIG. 17 is a diagram illustrating a portion of a display panel in which scanning circuits and emission circuits are arranged in a comparative example of a second embodiment.

2.1 Arrangement of Scanning Circuit and Emission Circuit 2.1.1 Arrangement in Comparative Example FIG. 17 is a diagram illustrating a portion of a display panel in which the scanning circuits 51 and the emission circuits 61 are arranged in a comparative example of the present embodiment. As illustrated in FIG. 17, the arrangement of the scanning circuits 51 and the emission circuits 61 on the first side 13a of the display panel 10 is the same as the comparative example of the first embodiment illustrated in FIG. 9, and thus descriptions thereof will be omitted.

In the first corner portion 12a, the unit circuit blocks 70 in which the scanning circuits 51 and the emission circuits 61 are arranged in series are arranged so as to spread radially outward with the scanning circuits 51 facing the outer peripheral edge 15a of the display region 15. In a case where the unit circuit blocks 70 are arranged in such a radially spreading pattern, there is a problem in that the width of the first corner portion 12a is wider than the width of the first side 13a. Note that in FIG. 17, a description is given in which the unit circuit blocks 70 are arranged on the first side 13a and the first corner portion 12a of the display panel 10. However, the unit circuit blocks 70 may be arranged in the third side 13c and the second corner portion 12b as well.

2.1.2 Arrangement in the Present Embodiment

Figure 18:
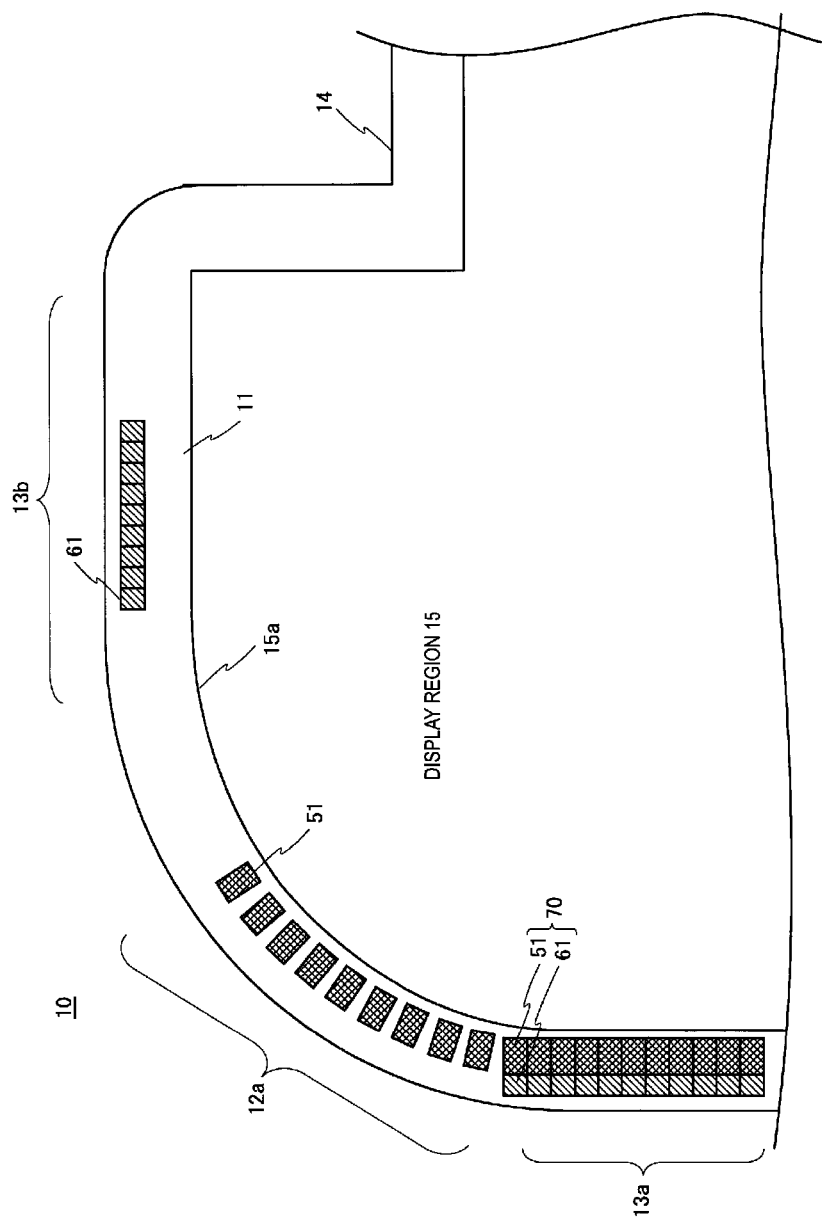
FIG. 18 is a diagram illustrating a portion of a display panel in which scanning circuits and emission circuits are arranged in a display device according to the second embodiment.

FIG. 18 is a diagram illustrating a portion of the display panel in which the scanning circuits 51 and the emission circuits 61 are arranged in the display device according to the present embodiment. As illustrated in FIG. 18, in the frame of the first side 13a of the display panel 10, the unit circuit blocks 70 in which the scanning circuits 51 and the emission circuits 61 are arranged in series are arranged in the same manner as in the case of the comparative example of the first embodiment, so the description thereof will be omitted.

In the first corner portion 12a, only the scanning circuits 51 that constitute the unit circuit blocks 70 are arranged so as to spread radially outward facing the outer peripheral edge 15a of the display region 15. The emission circuits 61 corresponding to the scanning circuits 51 arranged in the first corner portion 12a are arranged in a row on the second side 13b. In this way, only the scanning circuits 51 are arranged in the first corner portion 12a, so that it is possible to narrow the width of the first corner portion 12a. Note that each of the scanning circuits 51 arranged in the first corner portion 12a is preferably arranged so that the distance to the outer peripheral edge 15a is approximately 10 to 20 μm, for example.

Figure 19:
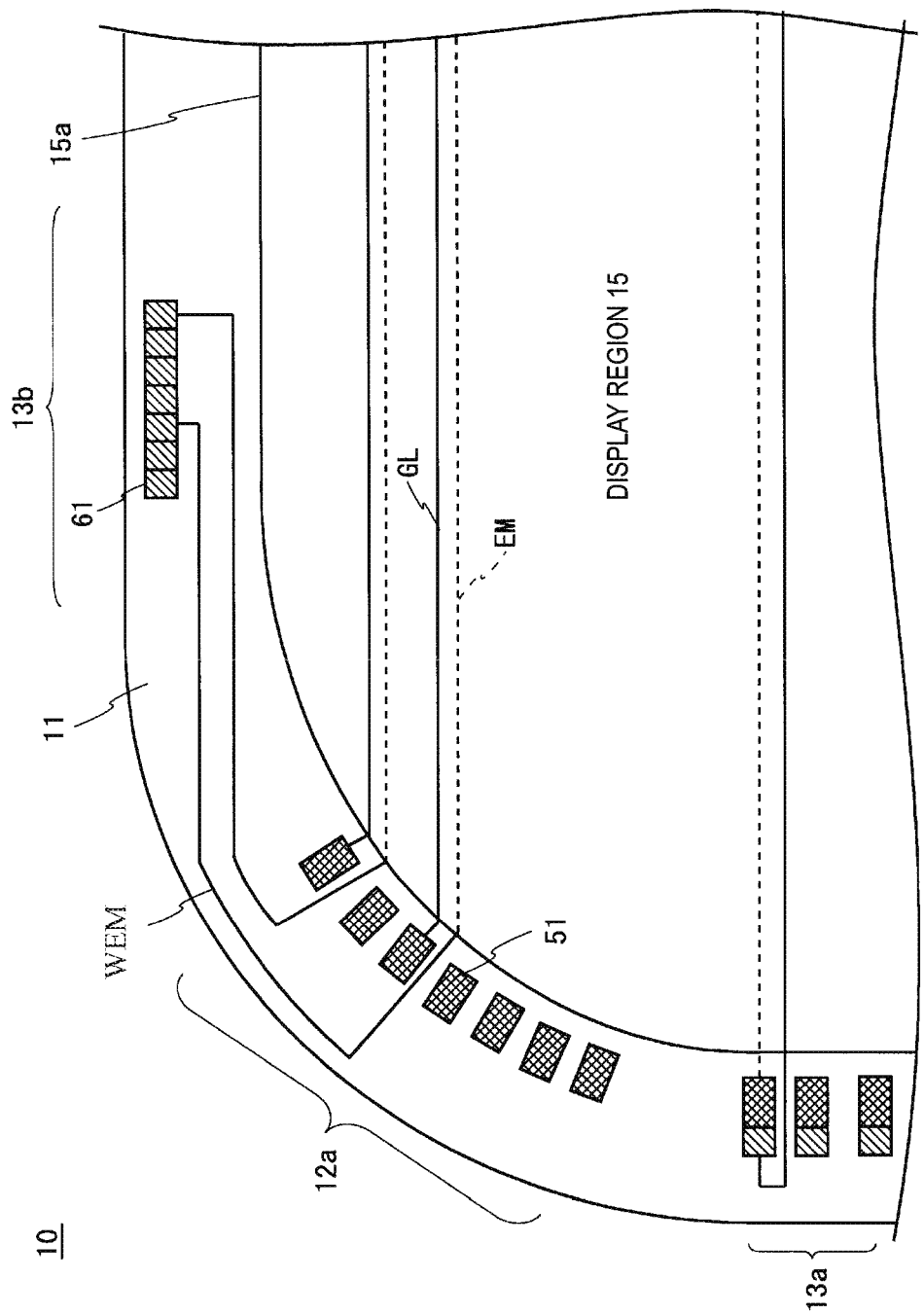
FIG. 19 is a diagram illustrating a portion of wiring lines for connecting the scanning circuits arranged on the display panel illustrated in FIG. 18 to scanning lines and connecting the emission circuits to light emission control lines.

FIG. 19 is a diagram illustrating a portion of wiring lines for connecting the scanning circuits 51 arranged on the first side 13a and the first corner portion 12a of the display panel 10 illustrated in FIG. 18 to the scanning lines, and connecting the emission circuits 61 to the light emission control line. A wiring line extending from a scanning circuit 51 arranged in the first corner portion 12a illustrated in FIG. 19 to the display region 15 is connected to a scanning line GL in the display region 15. A wiring line WEM extending from an emission circuit 61 extends through a gap provided between the corresponding scanning circuit 51 and an adjacent scanning circuit 51 to the display region 15 and is connected to a light emission control line EM.

Each of the wiring lines extending from the scanning circuits 51 arranged in the first corner portion 12a to the display region 15 is connected to a corresponding scanning line GL. A wiring line WEM from an emission circuit 61 arranged on the second side 13b extends to the first corner portion 12a along the outer peripheral edge of the second side 13b, further extends to the display region 15 through a gap provided between the corresponding scanning circuit 51 and an adjacent scanning circuit 51 arranged in the first corner portion 12a, and is connected to a corresponding light emission control line EM. In this way, the width of the first corner portion 12a can be made narrower than the case of the comparative example by arranging only the scanning circuits 51 in the first corner portion 12a and arranging the emission circuits 61 in a row on the second side 13b.

Note that, similar to the case of the first modified example of the first embodiment, in the present embodiment as well, only the emission circuits 61 may be arranged so as to spread radially in the first corner portion 12a, and the scanning circuits 51 may be arranged in a row on the second side 13b, or similar to the case of the second modified example, the scanning circuits 51 and the emission circuits 61 may be alternately arranged so as to spread radially in the first corner portion 12a, and the emission circuits 61 and the scanning circuits 51 corresponding to them may be alternately arranged in a row on the first side 13a.

2.2 Effects

According to the present embodiment, in the display panel 10, the scanning circuit 51 and the emission circuit 61 constituting each of the unit circuit blocks 70 are separated, and the scanning circuits 51 are arranged so as to spread radially from the outer peripheral edge 15a of the display region 15 in the first corner portion 12a of the display panel 10, and the emission circuits 61 are arranged in a row along the outer peripheral edge 15a of the second side 13b. As a result, the width of the first corner portion 12a can be made narrower and thus the frame of the display panel 10 can be made narrower.

3. Third Embodiment

The configuration, the actions, and the display panel having an irregular shape used in the display device according to a third embodiment are the same as those of the first embodiment, and thus descriptions thereof will be omitted.

3.1 Arrangement of Scanning Circuit and Emission Circuit

3.1.1 Arrangement in Comparative Example

Figure 20:
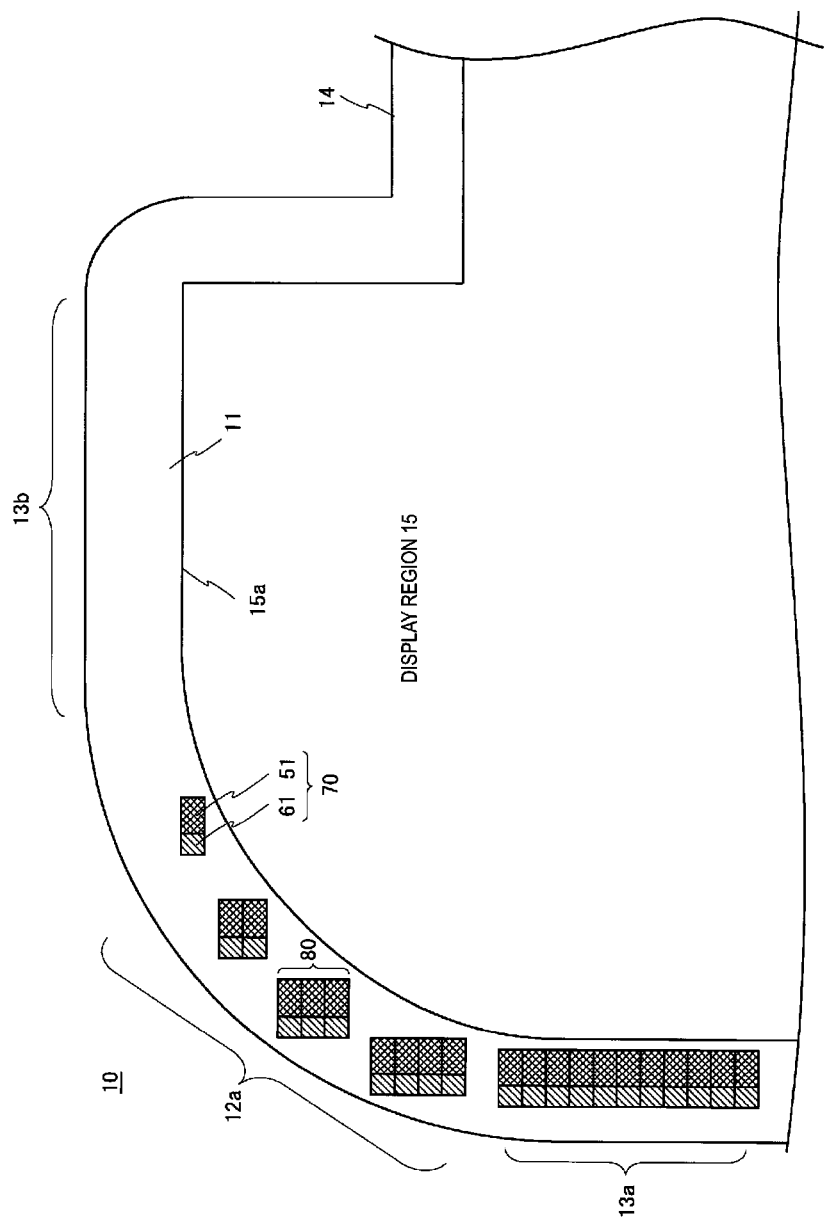
FIG. 20 is a diagram illustrating a portion of a display panel in which parallel circuit blocks in which a plurality of circuit blocks including scanning circuits and emission circuits are arranged in parallel are arranged on a first corner portion in a comparative example of a third embodiment.

FIG. 20 is a diagram illustrating a portion of a display panel 10 in which a plurality of parallel circuit blocks 80 are arranged in the first corner portion 12a in a comparative example of the present embodiment. As illustrated in FIG. 20, the arrangement of the scanning circuits 51 and the emission circuits 61 on the first side 13a of the display panel 10 is the same as the case of the comparative example illustrated in FIG. 9, and thus descriptions thereof will be omitted.

In the first corner portion 12a, the parallel circuit blocks 80 in which a plurality of the scanning circuits 51 are arranged in parallel are arranged along the outer peripheral edge 15a of the display region 15. The number of unit circuit blocks 70 constituting the parallel circuit blocks 80 arranged in the first corner portion 12a is adjusted to be less as a region closer from the first side 13a toward the second side 13b so that the width of the frame 11 does not increase.

Figure 21:
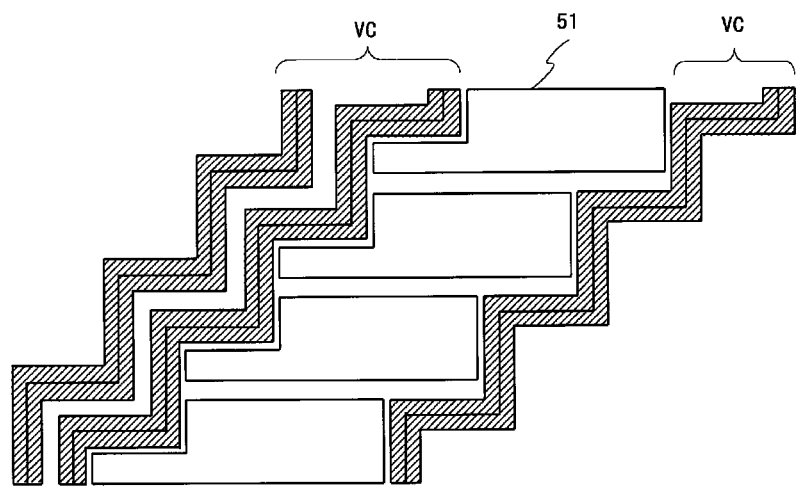
FIG. 21 is a diagram illustrating another problem in a case where the scanning circuits are arranged while shifted on the frame of the curved line region in the first corner portion of the first embodiment.

FIG. 21 is a diagram illustrating another problem in a case where the scanning circuits 51 are arranged while shifted in the first corner portion 12a of the first embodiment. As illustrated in FIG. 21, the scanning circuits 51 are arranged while shifted along the outer peripheral edge 15a of the first corner portion 12a, and the emission circuits (not illustrated) are arranged in a row on the second side 13b. Wiring lines VC such as clock wiring lines, power source wiring lines, or the like for supplying clock signals EMCK, a power supply voltage, or the like from the outside necessary to drive these emission circuits need to be extended to the emission circuits. In this case, in order to narrow the width of the first corner portion 12a, the wiring lines VC need to be arranged along the scanning circuits 51. For this reason, the shape of the scanning circuits 51 is not rectangular, but needs to be an irregular shape having a portion protruding. However, in a case where the scanning circuits 51 are formed into such an irregular shape, there is a problem in that the designing becomes difficult because the area becomes smaller.

3.1.2 Arrangement in the Present Embodiment

Figure 22:
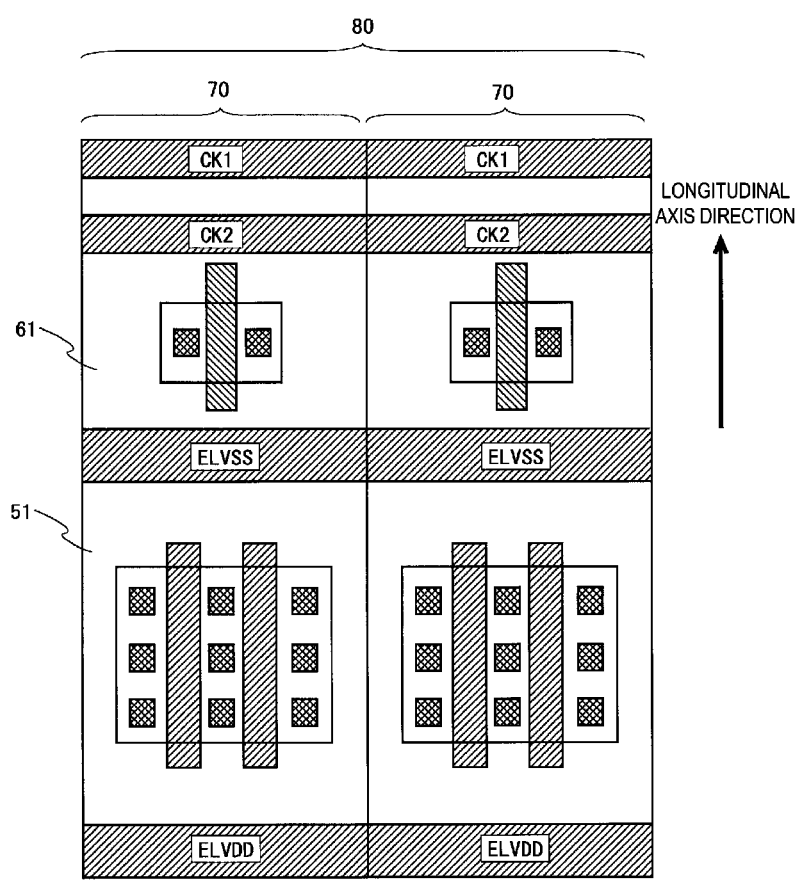
FIG. 22 is a diagram illustrating a configuration of a parallel circuit block arranged on a first side in the third embodiment.
Figure 23:
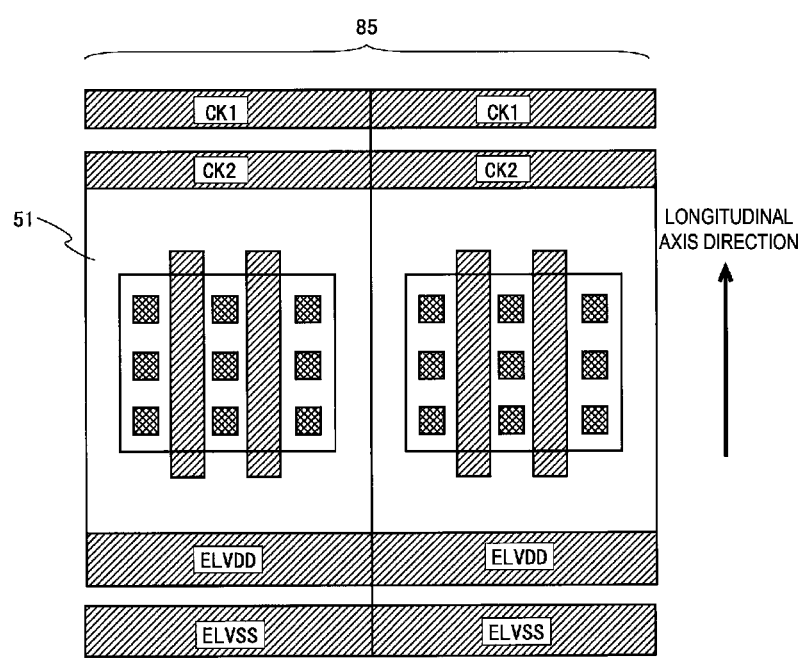
FIG. 23 is a diagram illustrating a configuration of a parallel circuit block arranged on a first corner portion in the third embodiment.

The shape and arrangement of the parallel circuit blocks 80 will be described. FIG. 22 is a diagram illustrating a configuration of a parallel circuit block 80 arranged on the first side 13a, and FIG. 23 is a diagram illustrating a configuration of a parallel circuit block 85 arranged in the first corner portion 12a. As illustrated in FIG. 22, the parallel circuit block 80 arranged on the first side 13a is a circuit block having a rectangular shape in which a plurality of unit circuit blocks 70 are arranged in parallel in a direction orthogonal to the longitudinal axis direction, each having a scanning circuit 51 and an emission circuit 61 having a rectangular shape arranged in series in the longitudinal axis direction. On the outside of the emission circuits 61, two clock signal lines CK1 and CK2 are arranged parallel to one side of the parallel circuit block 80, and the emission circuits 61 and the scanning circuits 51 are provided with clock signals CK1 and CK2 from these clock signal lines CK1 and CK2 respectively. The drive voltage lines ELVSS and ELVDD are respectively arranged between the scanning circuits 51 and the emission circuits 61, and on the outside of the scanning circuits 51 parallel to the clock signal lines CK1 and CK2, and the emission circuits 61 and scanning circuits 51 are provided with drive voltages ELVSS and ELVDD from these drive voltage lines ELVSS and ELVDD respectively.

As illustrated in FIG. 23, the parallel circuit block 85 arranged in the first corner portion 12a is constituted of only the scanning circuits 51 having a rectangular shape. Thus, unlike the parallel circuit block 80, the parallel circuit block 85 arranged in the first corner portion 12a is a circuit block having a rectangular shape in which only a plurality of the scanning circuits 51 are arranged in parallel in a direction orthogonal to the longitudinal axis direction. The two clock signal lines CK1 are CK2 are arranged along one side of the parallel circuit block 85, and the drive voltage lines ELVSS are ELVDD are arranged along the opposite side of the parallel circuit block 85. Clock signals CK1 and CK2 are supplied to each scanning circuit 51 from the clock signal lines CK1 and CK2, and drive voltages ELVSS and ELVDD are supplied from the drive voltage lines ELVSS and ELVDD. Note that in a case of arranging parallel circuit blocks constituted with the emission circuits 61 in the first corner portion 12a, the emission circuits 61 are arranged in place of the scanning circuits 51 in FIG. 23.

3.1.3 Arrangement in the Present Embodiment

Figure 24:
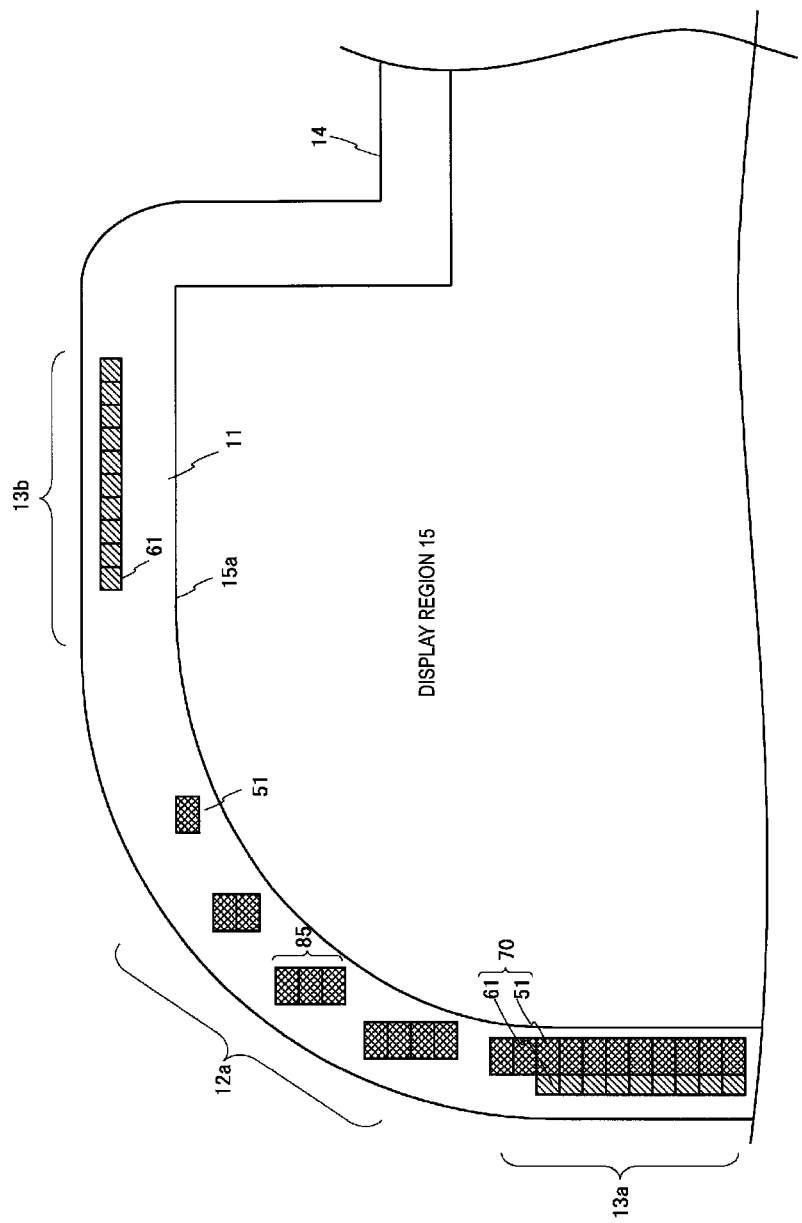
FIG. 24 is a diagram illustrating a portion of a display panel in which parallel circuit blocks in which a plurality of circuit blocks including scanning circuits are arranged in parallel are arranged on a frame of a curved line region in the third embodiment.

FIG. 24 is a diagram illustrating a portion of a display panel 10 in which parallel circuit blocks 85 having a plurality of the scanning circuits 51 arranged in parallel are arranged in the first corner portion 12a in the present embodiment. As illustrated in FIG. 24, the arrangement of the scanning circuits 51 and the emission circuits 61 on the first side 13a of the display panel 10 is the same as the case of the comparative example illustrated in FIG. 9, and thus descriptions thereof will be omitted.

In the first corner portion 12a, the scanning circuits 51 and the emission circuits 61 are separated, the parallel circuit blocks 85 having only a plurality of the scanning circuits 51 arranged in parallel without shifting are arranged along the outer peripheral edge 15a of the display region 15, and the emission circuits 61 which have constituted the parallel circuit blocks 80 together with the scanning circuits 51 are arranged in a row on the second side 13b. In this way, by arranging only the parallel circuit blocks 85 in which only a plurality of the scanning circuits are arranged in parallel in the first corner portion 12a, the width of the frame of the first corner portion 12a can be narrowed. Note that, as in the case of the comparative example, the number of scanning circuits 51 included in the parallel circuit blocks 80 arranged in the first corner portion 12a becomes small as the scanning circuit 51 is located closer from the first side 13a toward the second side 13b.

Figure 25:
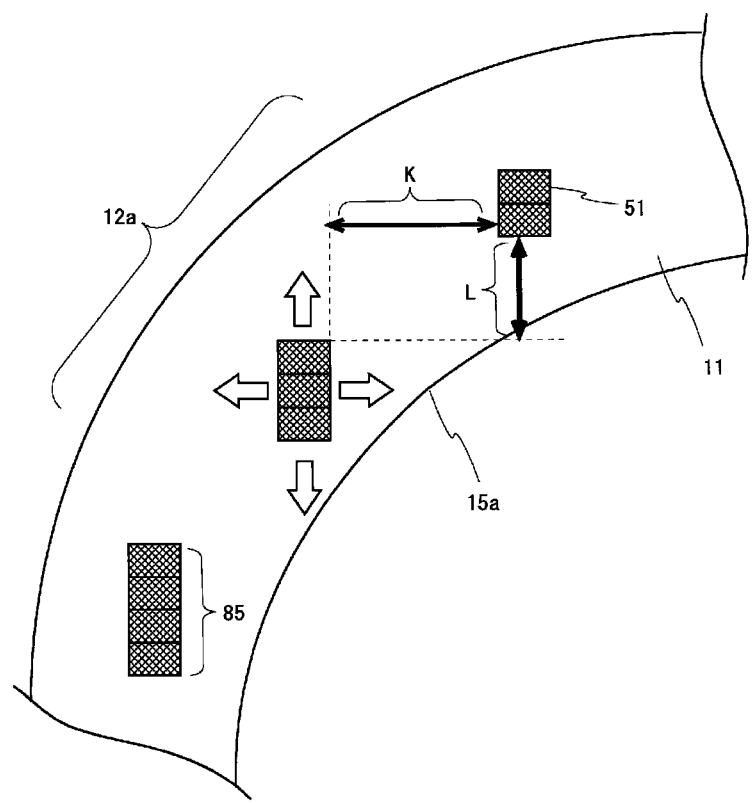
FIG. 25 is a diagram illustrating an arrangement relationship of the parallel circuit blocks in the first corner portion.

FIG. 25 is a diagram illustrating the arrangement relationship of the parallel circuit blocks 85 in the first corner portion 12a. As illustrated in FIG. 25, each of the parallel circuit blocks 85 arranged in the first corner portion 12a is arranged at a position separated from the adjacent parallel circuit block 85 in the horizontal direction (the left-right direction in FIG. 25) by the distance K and in the vertical direction (the up-down direction in FIG. 25) by L. Therefore, the other parallel circuit blocks 85 are not arranged in the horizontal direction or the vertical direction of each parallel circuit block 85. At this time, the parallel circuit blocks 85 may be said not overlapping in either direction. In this case, a vacant area capable of routing wiring lines can be provided around each of the parallel circuit blocks 85. Thus, by using this vacant area, it is easy to drive the wiring lines.

In this way, by arranging the parallel circuit blocks 85 in which a plurality of the scanning circuits 51 are arranged in parallel in the first corner portion 12*a*, the width of the first corner portion 12*a* can be narrowed. Note that each of the parallel circuit blocks 85 arranged in the first corner portion 12*a* is preferably arranged so that the distance from the corner portion to the outer peripheral edge 15*a* is approximately 10 to 20 μm, for example.

Figure 26:
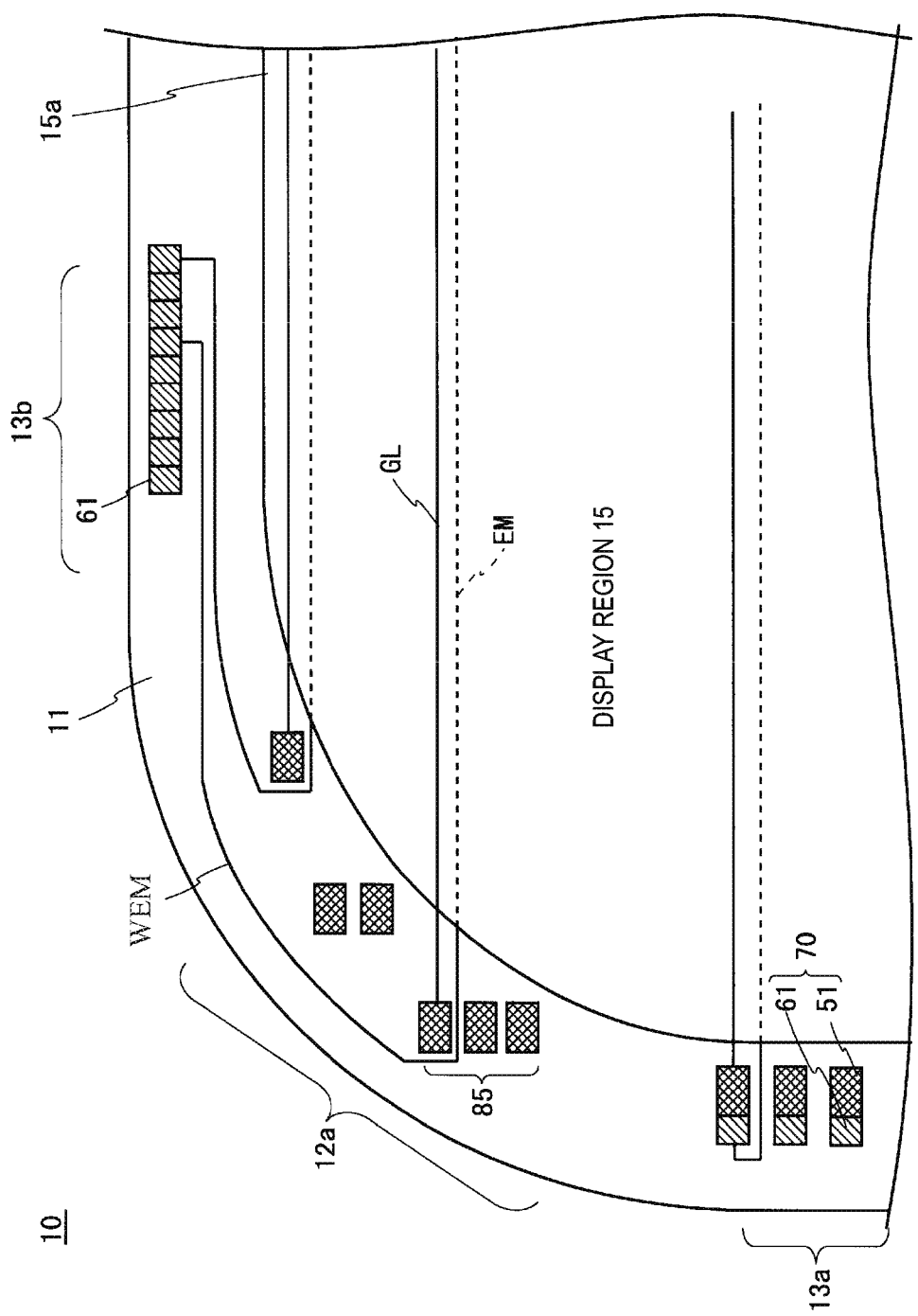
FIG. 26 is a diagram illustrating a portion of wiring lines for connecting the scanning circuits arranged in the first corner portion of the display panel illustrated in FIG. 24 to scanning lines and connecting the emission circuits to light emission control lines.

FIG. 26 is a diagram illustrating a portion of wiring lines for connecting the scanning circuits 51 arranged in the first corner portion 12*a* of the display panel 10 illustrated in FIG. 24 to the scanning lines, and connecting the emission circuits 61 arranged on the second side 13*b* to the light emission control lines. As illustrated in FIG. 26, each of the wiring lines extending from the scanning circuits 51 and the emission circuits 61 arranged on the first side 13*a* to the display region 15 is the same as in the case of the first embodiment illustrated in FIG. 12, and thus descriptions thereof will be omitted.

Each of the wiring lines that output the scanning signals from the scanning circuits 51 constituting the parallel circuit blocks 85 arranged in the first corner portion 12*a* extends to the display region 15, and is connected to a scanning line GL formed in the display region 15. Each of the wiring lines WEM that output the light emission control signals from the emission circuits 61 arranged on the second side 13*b* extends to the first corner portion 12*a* along the second side 13*b*, further extends through a gap provided between a corresponding scanning circuit 51 and an adjacent scanning circuit 51 arranged in the first corner portion 12*a* to the display region 15, and is connected to a light emission control line EM formed in the display region 15.

Note that, in the present embodiment as well, similar to the case of the first embodiment, the positions where the scanning circuits 51 are arranged and the positions where the emission circuits 61 are arranged may be inversed, parallel circuit blocks in which a plurality of the emission circuits 61 are arranged in parallel may be arranged in the first corner portion 12*a*, and the scanning circuits 51 may be arranged in a row on the second side 13*b*.

Figure 27:
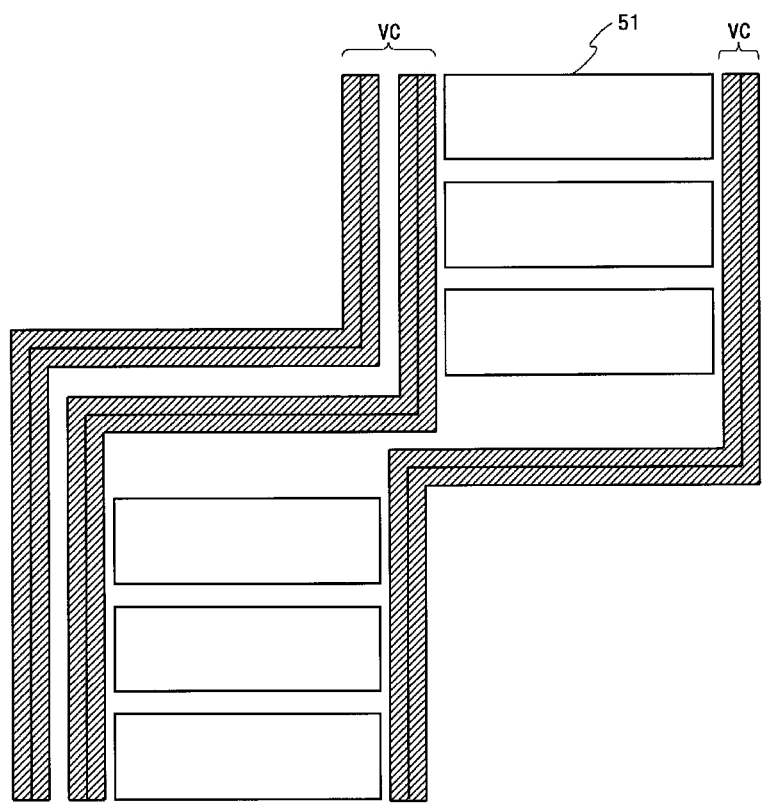
FIG. 27 is a diagram illustrating wiring lines around the scanning circuits arranged in the first corner portion of the display panel of the third embodiment.

FIG. 27 is a diagram illustrating wiring lines arranged around the scanning circuits 51 arranged in the first corner portion 12*a* of the display panel 10 of the present embodiment. As illustrated in FIG. 27, in a case where each of the parallel circuit blocks 85 is arranged to be shifted so that the parallel circuit blocks 85 in which a plurality of the scanning circuits 51 are arranged in parallel are not overlapping in the up-down direction and the left-right direction, the wiring lines VC that supply clock signals or the like to the emission circuits (not illustrated) are formed along the side surface of the parallel circuit block 85. Thus, unlike the case illustrated in FIG. 21, the wiring lines VC are straight lines in the vicinity of each of the parallel circuit blocks. As a result, the shape of the scanning circuits 51 can be rectangular, so the designing of the scanning circuits 51 can be easier.

3.2 Effects

According to the present embodiment, in the display panel 10, the scanning circuits 51 and the emission circuits 61 are separated, only the parallel circuit blocks 85 in which a plurality of the scanning circuits are arranged in parallel are arranged in the first corner portion 12*a*, and the emission circuits 61 are arranged in a row along the second side 13*b*. As a result, the width of the first corner portion 12*a* can be made narrower. and thus the frame of the display panel 10 can be made narrower.

The number of scanning circuits 51 included in the parallel circuit blocks 85 arranged in the first corner portion 12*a* decreases as a region closer from the first side 13*a* toward the second side 13*b*. This makes it possible to prevent the width of the first corner portion 12*a* from becoming wider because the heights of the parallel circuit blocks 85 are reduced.

Each of the parallel circuit blocks 85 arranged in the first corner portion 12*a* is arranged so as not to overlap with the other parallel circuit blocks 85 in the horizontal direction and the vertical direction. As a result, the wiring lines VC that supply the clock signals and the like to the emission circuits 61 are formed along the side surface of the parallel circuit block 85. Thus, the wiring lines are formed in straight lines in the vicinity of the parallel circuit blocks 85. As a result, the shape of the scanning circuits 51 can be rectangular, so the designing of the scanning circuits 51 can be easier. It is easy to drive the wiring lines that output the light emission control signals from the emission circuits 61 arranged on the first side 13*a*.

4. Other Shapes of Display Panel and Display Region

Figure 28:
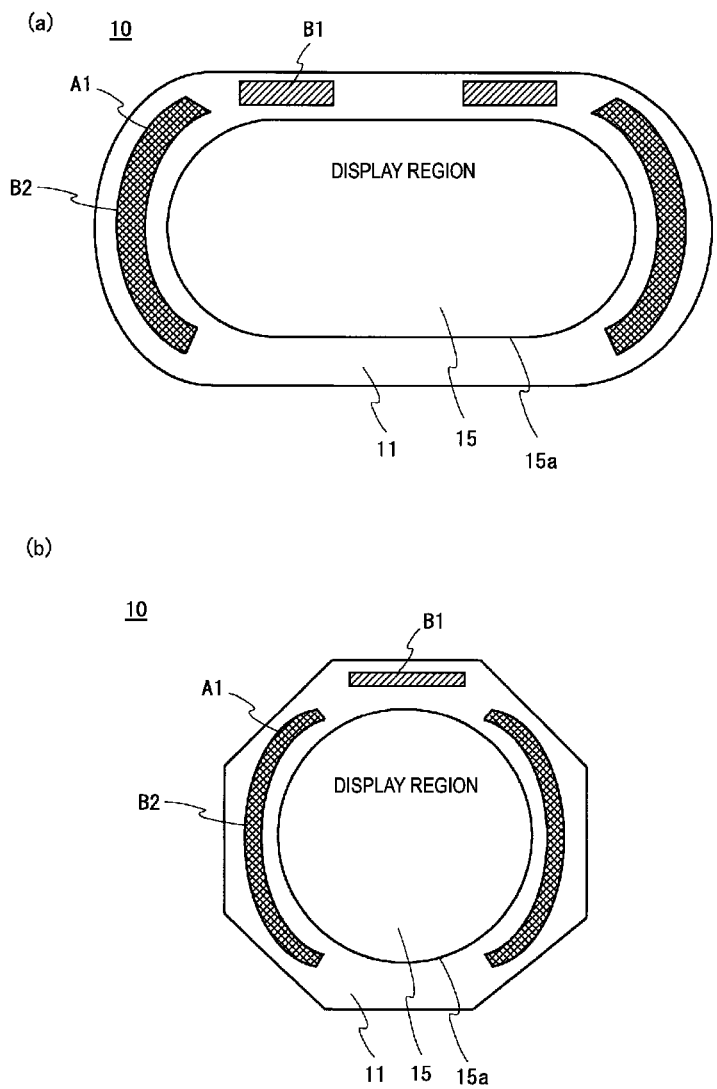
FIG. 28 is a diagram illustrating an example of a shape of a display panel and display region to which the first to third embodiments can be applied.

In each of the above-described embodiments, a frame 11 with a corner portion curved and a display region 15 are described. However, the disclosure can also be applied in a case where the shape of the display panel 10 and the display region 15 is as follows. FIGS. 28 and 29 are diagrams illustrating an example of a shape of a display panel and display region to which the first to third embodiments can be applied. As illustrated in FIGS. 28 and 29, for example, the outer shape of the display panel 10 may be a shape constituted by only curved lines or a shape constituted by inclined straight lines. Similarly, the outer peripheral edge 15*a* of the display region 15 may also have a shape represented by only curved lines or a polygonal shape constituted by inclined straight lines. Note that in the frame 11 and the display region 15 of the display panel 10 illustrated in FIG. 29, the inner side and the outer side of the four corner portions are inclined straight lines, so they are referred to as inclined regions.

For example, as illustrated in FIG. 28(*a*), both the shape of the display panel 10 and the display region 15 may be elliptical, or, as illustrated in FIG. 28(*b*), the shape of the display panel 10 may be an octagonal shape, and the shape of the display region 15 may be a circular shape. As illustrated in FIG. 29(*a*), both the shape of the display panel 10 and the display region 15 may be an oblong octagonal shape, or as illustrated in FIG. 29(*b*), both the shape of the display panel 10 and the display region 15 may be an octagonal shape.

In any case, only the scanning circuits 51 are arranged along the outer peripheral edge 15*a* in the first corner portion A1, which is a curved line region or an inclined region of the display panel 10, the scanning circuits 51 and the emission circuits 61 are arranged on the first side B2, which is a straight line region, and the emission circuits 61 corresponding to the scanning circuits 51 arranged in the first corner portion A1 are arranged on the second side B1 of the upper portion of the display panel 10. Note that, in any case, the emission circuits 61 may be arranged in the first corner portion A1, and the scanning circuits 51 may be arranged on the second side B1. These are examples, and the disclosure can be applied to a case where the scanning circuits 51 and the emission circuits 61 are arranged in the frame 11 of the display panel having various shapes in which the first corner portion A1 is formed.

5. Supplement

A display device according to Supplement 1 is a display device including a display panel including a display region including a plurality of scanning lines, a plurality of light emission control lines extending parallel to the plurality of scanning lines, a plurality of data lines intersecting with the plurality of scanning lines and the plurality of light emission control lines, and a plurality of pixel circuits each provided at or near each of intersections between the plurality of scanning lines and the plurality of data lines, and a frame provided around the display region, and provided with a plurality of scanning circuits configured to output scanning signals to the plurality of scanning lines, and a plurality of emission circuits configured to output light emission control signals to the plurality of light emission control lines, wherein the frame includes at least one corner portion formed with a curved line region or an inclined region, and a first side parallel to the plurality of data lines and a second side parallel to the plurality of scanning lines formed to sandwich the corner portion, either circuits of the plurality of scanning circuits or the plurality of emission circuits are arranged on the second side, and wiring lines extending from the either circuits arranged on the second side extend from the second side to the corner portion, and are connected to the plurality of scanning lines or the plurality of light emission control lines in an outer peripheral edge of the display region.

The display device according to Supplement 2 is the display device according to Supplement 1, wherein the plurality of scanning circuits and the plurality of emission circuits are arranged on the first side, and other circuits of the plurality of scanning circuits or the plurality of emission circuits are arranged in the corner portion.

According to the display device according to Supplement 2, by arranging only one type of circuit in the corner portion, the width of the corner portion can be made narrower. In a case where wiring lines extending from the scanning circuits are prolonged, misalignment of the drive timing due to delay of the scanning signals occurs and causes adverse effects, but by arranging the scanning circuits in a corner portion close to the display region, adverse effects can be reduced by preventing delay of the scanning signals.

The display device according to Supplement 3 is the display device according to Supplement 1, wherein the plurality of scanning circuits are arranged in the corner portion, and the plurality of emission circuits are arranged on the second side.

According to the display device according to Supplement 3, by arranging only the scanning circuits in the corner portion, the width of the corner portion can be made narrower. In a case where wiring lines extending from the scanning circuits are prolonged, misalignment of the drive timing due to delay of the scanning signals occurs, but by arranging the scanning circuits in a corner portion close to the display region, the delay of the scanning signals can be prevented.

The display device according to Supplement 4 is the display device according to Supplement 1, wherein the plurality of emission circuits are arranged in the corner portion, and the plurality of scanning circuits are arranged on the second side.

According to the display device according to Supplement 4, by arranging only the emission circuits in the corner portion, the width of the corner portion can be made narrowed.

The display device according to Supplement 5 is the display device according to Supplement 1, wherein each of regions of the plurality of scanning circuits and the plurality of emission circuits has a rectangular shape, and the other circuits arranged on the corner portion are arranged in a stepwise manner along the outer peripheral edge with one sides of the circuits being parallel to an extending direction of the plurality of scanning lines.

According to the display device according to Supplement 5, the other circuits arranged in the corner portion are arranged in a stepwise manner parallel to the extending direction of the scanning lines along the outer peripheral edge, so it is possible to connect the other circuits and the wiring lines formed in the display region at the shortest distance. As a result, the delay of the signals output from the other circuits can be reduced, and the width of the corner portion can be made narrower.

The display device according to Supplement 6 is the display device according to Supplement 1, wherein each of regions of the plurality of scanning circuits and the plurality of emission circuits has a rectangular shape, and the other circuits arranged on the corner portion are arranged in a radially spreading pattern with one sides of the circuits facing the outer peripheral edge along the outer peripheral edge.

According to the display device according to Supplement 6, the other circuits arranged in the corner portion are arranged in a radially spreading pattern with the one sides thereof facing the outer peripheral edge, and thus, as in the case of Supplement 5, the delay of the signals output from the other circuits can be reduced, and the width of the corner portion can be made narrower.

The display device according to Supplement 7 is the display device according to Supplement 1, wherein a parallel circuit block including a plurality of either circuits of the plurality of scanning circuits or the plurality of emission circuits each having a rectangular shape being arranged in parallel has a rectangular shape, and the parallel circuit block is arranged not to overlap in either direction with any of other parallel circuit blocks arranged in the corner portion with one side being parallel to an extending direction of the plurality of scanning lines in the corner portion.

According to the display device according to Supplement 7, the parallel circuit block arranged in the corner portion is arranged so as not to overlap in either direction with any of other parallel circuit blocks arranged in the corner portion with one side being parallel to an extending direction of the scanning lines. As a result, the wiring line region can be secured around the parallel circuit block, thereby increasing the degree of freedom of wiring lines in the corner portion.

The display device according to Supplement 8 is the display device according to Supplement 7, wherein a clock signal line is arranged along the one side of the parallel circuit block having a rectangular shape arranged in the corner portion, a drive voltage line is arranged along another side opposite to the one side, and the plurality of scanning circuits or the plurality of emission circuits constituting the parallel circuit block are connected to the clock signal line and the drive voltage line, and are arranged in parallel with sides other than the one side and the another side being in contact with each other.

According to the display device according to Supplement 8, because the parallel circuit block has a rectangular shape, by arranging the clock signal line along one side thereof, and arranging the drive voltage line along the other side arranged in opposition, the clock signal and the drive voltage are easily supplied to the circuits constituting the parallel circuit block.

The display device according to Supplement 9 is the display device according to Supplement 1, wherein the plurality of scanning circuits and the plurality of emission circuits are alternately arranged along the outer peripheral edge of the corner portion.

According to the display device according to Supplement 9, similar to the display device according to Supplement 5, the delay of the signals output from the circuits can be reduced, and the width of the corner portion can be made narrower.

The display device according to Supplement 10 is the display device according to Supplement 2, wherein the plurality of scanning circuits arranged on the first side include a plurality of scanning circuits arranged per single emission circuit outside of the plurality of emission circuits arranged along the outer peripheral edge, and a width of the single emission circuit is narrower than a total width of the plurality of scanning circuits, and a wiring line extending from each of the plurality of the scanning circuits is arranged to sandwich a plurality of wiring lines branched from a wiring line extending from the single emission circuit.

According to the display device according to Supplement 10, because there is no need to provide a gap in the first side for conducting a wiring line for connecting a scanning circuit and a scanning line between adjacent emission circuits. the scanning circuits and the emission circuits can be efficiently arranged on the first side. As a result, the frame of the display panel can be made narrower.

The display device according to Supplement 11 is the display device according to Supplement 3, wherein each wiring line extending from the emission circuits arranged on the second side to the corner portion is branched into a plurality of wiring lines, and the plurality of wiring lines are connected to a plurality of the light emission control lines formed in the display region.

According to the display device according to Supplement 11, a wiring line extending from an emission circuit arranged on the second side branches into a plurality of wiring lines, and the wiring lines are connected to a plurality of light emission control lines. As a result, the number of wiring lines extending from the emission circuits to the corner portion is reduced, so the width of the corner portion can be made narrower.

The display device according to Supplement 12 is the display device according to Supplement 1, wherein a cathode electrode of electro-optical elements included in the pixel circuits is constituted of a single metal film covering the display region and the frame, and the metal film is formed to overlap with at least circuits of the plurality of scanning circuits and the plurality of emission circuits arranged adjacent to the display region via an insulating film in the frame, and includes a connection terminal connectable to wiring lines configured to supply a power source from outside.

According to the display device according to Supplement 12, the cathode electrode of all of the electro-optical elements can be formed by one metal film, and thus the cathode electrode of the electro-optical elements of all of the pixel circuits formed in the display panel can be easily formed. By simply applying a predetermined potential to the metal film, the potential of the entire cathode electrode can be made the same value at the same time.

The display device according to Supplement 13 is the display device according to Supplement 1, wherein the display panel further includes a terminal portion configured to connect wiring lines for providing signals from outside to wiring lines provided on the display panel, and the terminal portion is provided at a position opposite the second side with the display region interposed between the terminal portion and the second side.

According to the display device according to Supplement 13, the corner portion and the second side are provided at the positions opposed to the terminal portion with the display portion interposed therebetween, and thus there is no need for a region for arranging other wiring lines such as clock signal lines arranged near the terminal portion. As a result, the width of the corner portion adjacent to the second side can be made narrower.

The display device according to Supplement 14 is the display device according to Supplement 1, wherein the frame of the display panel further includes a third side opposite the first side with the display region interposed between the frame and the first side, and a corner portion sandwiched between the second side and the third side, and the either circuits are arranged on the second side.

According to the display device according to Supplement 14, because the scanning circuits and the emission circuits can be arranged in the corner portion sandwiched between the second side and the third side, and on the second side as well, the width of the corner portion can be made narrower.

The display device according to Supplement 15 is the display device according to Supplement 14, wherein the frame of the display panel further includes a fourth side opposite the second side with the display region interposed between the frame and the second side, and a corner portion sandwiched between the first side and the fourth side, or the second side and the fourth side, and the either circuits are arranged on the fourth side.

According to the display device according to Supplement 15, there are more corner portions in which either circuits of the scanning circuits or the emission circuits are arranged, and thus the width of the corner portions can be further made narrower.

REFERENCE SIGNS LIST

10 Display panel
11 Frame
12a First corner portion
12b Second corner portion
12c Third corner portion
12d Fourth corner portion
13a First side
13b Second side
13c Third side
13d Fourth side
15 Display region
15a Outer peripheral edge (of display region)

18 Terminal portion
19 Cathode (cathode electrode)
19a Connection terminal (of cathode)
51 Scanning circuit
61 Emission circuit
70 Unit circuit block
80, 85 Parallel circuit block

The invention claimed is:

1. A display device comprising:
a display panel including
a display region including a plurality of scanning lines, a plurality of light emission control lines extending parallel to the plurality of scanning lines, a plurality of data lines intersecting with the plurality of scanning lines and the plurality of light emission control lines, and a plurality of pixel circuits each provided at or near each of intersections between the plurality of scanning lines and the plurality of data lines, and
a frame provided around the display region, and provided with a plurality of scanning circuits configured to output scanning signals to the plurality of scanning lines, and a plurality of emission circuits configured to output light emission control signals to the plurality of light emission control lines,
wherein the frame includes at least one corner portion formed with a curved line region or an inclined region, and a first side parallel to the plurality of data lines and a second side parallel to the plurality of scanning lines formed to sandwich the at least one corner portion,
either circuits of the plurality of scanning circuits or the plurality of emission circuits are arranged on the second side, and
wiring lines extending from the either circuits arranged on the second side extend from the second side to the at least one corner portion, and are connected to the plurality of scanning lines or the plurality of light emission control lines in an outer peripheral edge of the display region.

2. The display device according to claim 1,
wherein the plurality of scanning circuits and the plurality of emission circuits are arranged on the first side, and other circuits of the plurality of scanning circuits or the plurality of emission circuits are arranged in the at least one corner portion.

3. The display device according to claim 2,
wherein each of regions of the plurality of scanning circuits and the plurality of emission circuits has a rectangular shape, and the other circuits arranged on the at least one corner portion are arranged in a stepwise manner along the outer peripheral edge with one side of the other circuits being parallel to an extending direction of the plurality of scanning lines.

4. The display device according to claim 2,
wherein each of regions of the plurality of scanning circuits and the plurality of emission circuits has a rectangular shape, and the other circuits arranged on the at least one corner portion are arranged in a radially spreading pattern with one sides of the other circuits facing the outer peripheral edge along the outer peripheral edge.

5. The display device according to claim 2,
wherein the plurality of scanning circuits arranged on the first side include a plurality of scanning circuits arranged per single emission circuit outside of the plurality of emission circuits arranged along the outer peripheral edge, and
a width of the single emission circuit is narrower than a total width of the plurality of scanning circuits, and a wiring line extending from each of the plurality of the scanning circuits is arranged to sandwich a plurality of wiring lines branched from a wiring line extending from the single emission circuit.

6. The display device according to claim 1,
wherein the plurality of scanning circuits are arranged in the at least one corner portion, and the plurality of emission circuits are arranged on the second side.

7. The display device according to claim 6,
wherein each wiring line extending from the emission circuits arranged on the second side to the at least one corner portion is branched into a plurality of wiring lines, and the plurality of wiring lines are connected to a plurality of the light emission control lines formed in the display region.

8. The display device according to claim 1,
wherein the plurality of emission circuits are arranged in the at least one corner portion, and the plurality of scanning circuits are arranged on the second side.

9. The display device according to claim 1,
wherein a parallel circuit block including a plurality of either circuits of the plurality of scanning circuits or the plurality of emission circuits each having a rectangular shape being arranged in parallel has a rectangular shape, and the parallel circuit block is arranged not to overlap in either direction with any of other parallel circuit blocks arranged in the at least one corner portion, with one side being parallel to an extending direction of the plurality of scanning lines in the at least one corner portion.

10. The display device according to claim 9,
wherein a clock signal line is arranged along the one side of the parallel circuit block having a rectangular shape arranged in the at least one corner portion, a drive voltage line is arranged along another side opposite to the one side, and the plurality of scanning circuits or the plurality of emission circuits constituting the parallel circuit block are connected to the clock signal line and the drive voltage line, and are arranged in parallel with sides other than the one side and the another side being in contact with each other.

11. The display device according to claim 1,
wherein the plurality of scanning circuits and the plurality of emission circuits are alternately arranged along the outer peripheral edge of the at least one corner portion.

12. The display device according to claim 1,
wherein a cathode electrode of electro-optical elements included in the pixel circuits is constituted of a single metal film covering the display region and the frame, and the metal film is formed to overlap with at least circuits of the plurality of scanning circuits and the plurality of emission circuits arranged adjacent to the display region via an insulating film in the frame, and includes a connection terminal connectable to wiring lines configured to supply a power source from outside.

13. The display device according to claim 1,
wherein the display panel further includes a terminal portion configured to connect wiring lines for providing signals from outside to wiring lines provided on the display panel, and the terminal portion is provided at a position opposite the second side with the display region interposed between the terminal portion and the second side.

14. The display device according to claim 1,
wherein the frame of the display panel further includes a third side opposite the first side with the display region interposed between the frame and the first side, and a corner portion sandwiched between the second side and the third side, and the either circuits are arranged on the second side.

15. The display device according to claim 14,
wherein the frame of the display panel further includes a fourth side opposite the second side with the display region interposed between the frame and the second side, and a corner portion sandwiched between the first side and the fourth side, or the second side and the fourth side, and the either circuits are arranged on the fourth side.

* * * * *